(12) United States Patent
King Liu et al.

(10) Patent No.: US 9,183,916 B2
(45) Date of Patent: Nov. 10, 2015

(54) ELECTRO-MECHANICAL DIODE NON-VOLATILE MEMORY CELL FOR CROSS-POINT MEMORY ARRAYS

(75) Inventors: Tsu-Jae King Liu, Fremont, CA (US); Wookhyun Kwon, Albany, CA (US)

(73) Assignee: The Regents of the University of California, Oakland, CA (US)

( * ) Notice: Subject to any disclaimer, the term of this patent is extended or adjusted under 35 U.S.C. 154(b) by 81 days.

(21) Appl. No.: 14/241,379

(22) PCT Filed: Sep. 12, 2012

(86) PCT No.: PCT/US2012/054931
§ 371 (c)(1),
(2), (4) Date: Feb. 26, 2014

(87) PCT Pub. No.: WO2013/040083
PCT Pub. Date: Mar. 21, 2013

(65) Prior Publication Data
US 2015/0016185 A1    Jan. 15, 2015

Related U.S. Application Data

(60) Provisional application No. 61/535,282, filed on Sep. 15, 2011.

(51) Int. Cl.
*G11C 11/00* (2006.01)
*G11C 11/38* (2006.01)
*H01L 27/102* (2006.01)
*G11C 11/36* (2006.01)
*G11C 11/50* (2006.01)

(52) U.S. Cl.
CPC ............ *G11C 11/38* (2013.01); *G11C 11/36* (2013.01); *G11C 11/50* (2013.01); *H01L 27/1021* (2013.01)

(58) Field of Classification Search
USPC ................................. 365/153, 175
See application file for complete search history.

(56) References Cited

U.S. PATENT DOCUMENTS

| | | | | |
|---|---|---|---|---|
| 6,643,165 | B2 * | 11/2003 | Segal et al. | ............ 365/151 |
| 2003/0122181 | A1 | 7/2003 | Wu | |
| 2007/0285969 | A1 | 12/2007 | Toda et al. | |
| 2008/0203469 | A1 | 8/2008 | Gruening-von Schwerin | |

(Continued)

FOREIGN PATENT DOCUMENTS

| | | |
|---|---|---|
| JP | 2008-288426 A | 11/2008 |
| WO | 2013/040083 | 3/2013 |

OTHER PUBLICATIONS

Akinaga et al. "Resistive Random Access Memory (ReRAM) Based on Metal Oxides", Proceedings of the IEEE, vol. 98, No. 12, Dec. 2010, pp. 2237-2251.

(Continued)

*Primary Examiner* — Vu Le
(74) *Attorney, Agent, or Firm* — Bever, Hoffman & Harms, LLP

(57) ABSTRACT

A non-volatile electro-mechanical diode memory cell is described for implementation of compact ($4F^2$) cross-point memory arrays. The electro-mechanical diode memory cells operate with relatively low set/reset voltages and excellent retention characteristics, and are multi-time programmable. Due to its simplicity, this electro-mechanical diode memory cell is attractive for implementation of three-dimensional memory arrays for higher storage density.

22 Claims, 26 Drawing Sheets

(56) References Cited

U.S. PATENT DOCUMENTS

2008/0303014 A1   12/2008   Goux et al.
2010/0157710 A1*  6/2010   Lambertson et al. ......... 365/218

OTHER PUBLICATIONS

Burr et al. "Oveview of candidate device technologies for storage-class memory", IBM Jounal of Reseach and Development, vol. 52, No. 4/5, Jul./Sep. 2008, pp. 449-464.

Choi et al. "Compact Nano-Electro-Mechanical Non-Volatile Memory (NEMory) for 3D Integration", IEEE International Electron Devices Meeting, 2007 (IEDM 2007), Dec. 10-12, 2007, pp. 603-606.

Flocke et al. "Fundamental Analysis of Resistive Nano-Crossbars for the Use in Hybrd Nano/CMOS-Memory", 33rd European Solid State Circuits Conference, 2007 (ESSCIRC 2007), Sep. 11-13, 2007, pp. 328-331.

Han et al. "Nanowire Mechanical Switch with a Built-In Diode", Small 2010, vol. 6, No. 11, pp. 1197-1200.

Jensen et al. "Adhesion effects on contact opening dynamics in micromachined switches", Journal of Applied Physics 97, 2005, 103535, 9 pgs.

Kim et al. "Multi-Layered Vertical Gate NAND Flash Overcoming Stacking Limit for Terabit Density Storage", 2009 Symposium on VLSI Technology Digest of Technical Papers, pp. 188-189.

Koh, Y. "NAND Flash Scaling beyond 20nm", IEEE International Memory Workshop, 2009 (IMW '09), May 10-14, 2009, pp. 1-3.

Lee et al. "2-stack 1D-1R Cross-point Structure with Oxide Diodes as Switch Elements for High Density Resistance RAM Applications", IEEE International Electron Devices Meeting, 2007 (IEDM 2007), Dec. 10-12, 2007, pp. 771-774.

Lee et al. "Electrical Characterization of Etch Rate for Micro- and Nano-Scale Gap Formation", Journal of Microelectromechanical Systems, vol. 19, No. 5, Oct. 2010, pp. 1260-1263.

Lue et al. "A Novel Buried-Channel FinFET BE-SONOS NAND Flash with Improved Memory Window and Cycling Endurance", 2009 Symposium on VLSI Technology Digest of Technical Papers, pp. 224-225.

Wong et al. "Phase Change Memory", Proceedings of the IEEE, vol. 98, No. 12, Dec. 2010, pp. 2201-2227.

Acquaviva, D. et al. "Capacitive nanoelectromechanical switch based on suspended carbon nanotube array", Applied Physics Letters 97, 233508 (2010), 3 pages.

Alley, R. L. et al. "The effect of release-etch processing on surface microstructure stiction", IEEE Solid-State Sensor and Actuator Workshop, Jun. 22-25, 1992, pp. 202-207.

Bhushan, B.: Introduction to Tribology, John Wiley & Sons, Aug. 1, 2002, pp. 169-206.

Chen, F. et al. "Integrated circuit design with NEM relays", IEEE/ACM International Conference on Computer-Aided Design (ICCAD 2008) Nov. 10-13, 2008, pp. 750-757.

Coventor, CoventorWare Analyzer, MEMS and Microsystems Design, Reference Manual, 2008, 368 pages.

Coventor, CovenrWare Designer, MEMS and Microsystems Physical Design, Reference Manual, 2008, 330 pages.

Lee, D. et al. "Scaling Limitations for Flexural Beams Used in Electromechanical Devices", IEEE Transactions on Electron Devices, vol. 56, No. 4, Apr. 2009, pp. 688-691.

Liang, J. et al. "Cross-Point Memory Array Without Cell Selectors—Device Characteristics and Data Storage Pattern Dependencies", IEEE Transactions on Electron Devices, vol. 57, No. 10, Oct. 2010, pp. 2531-2538.

Liu, C.: Foundations of MEMS, Pearson Prentice Hall, 2006, pp. 103-116.

* cited by examiner

US 9,183,916 B2

ELECTRO-MECHANICAL DIODE NON-VOLATILE MEMORY CELL FOR CROSS-POINT MEMORY ARRAYS

CROSS-REFERENCE TO RELATED APPLICATIONS

This application claim priority to U.S. Provisional Patent Application 61/535,282, entitled "Electro-Mechanical Diode Non-Volatile Memory Cell Design For Cross-Point Memory Arrays" filed Sep. 15, 2011.

STATEMENT REGARDING FEDERALLY SPONSORED RESEARCH OR DEVELOPMENT

This invention was made with Government support under Grant Number NBCH1090006 awarded by DARPA. The Government has certain rights in the invention.

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND

This description pertains generally to non-volatile memory cells, and more particularly to memory cells for cross-point arrays.

DESCRIPTION OF RELATED ART

Flash memory is a fast-growing memory market segment due to burgeoning demand for portable electronic devices. To date, memory cell size reduction with technology advancement has been the key to increasing storage capacity while lowering cost per bit. Fundamental scaling limitations for flash memory cell operating voltages and the physical thickness of the tunneling dielectric layer pose a significant challenge for continued scaling in the sub-20 nm regime. Alternative materials and structures have been proposed to overcome the scaling limit of a conventional flash memory cell. A cell design that is compatible with the cross-point memory array architecture is desirable, because this allows for the most compact storage ($4F^2$ cell layout area, where F is the minimum half-pitch).

Programmable resistance devices such as phase-change memory and resistive RAM have been explored for cross-point memory applications. Unfortunately, these devices generally require a "selector" device within each memory cell in order to reduce unwanted leakage current through unselected cells during a read operation. Otherwise, the size (number of rows/columns) of the array would be severely limited and memory-array area efficiency would be poor. However, the selector devices require additional process steps and can significantly reduce the cell current, thereby resulting in slower read operation.

An electro-mechanical non-volatile memory cell design that eliminates the need for a selector device by leveraging the hysteretic behavior of a mechanical gap-closing actuator is discussed by W. Y. Choi et al. in "Compact Nano-Electro-Mechanical Non-Volatile Memory (NEMory) For 3D Integration", IEEE International Electron Devices Meeting Technical Digest, pages 603-606, 2007. Although suitable for a cross-point array architecture, the Choi memory cell design requires separate read and write word lines, as well as an initial "forming" step (charging of a dielectric layer) to achieve non-volatile operation.

Therefore, a need arises for a memory cell, suitable for a cross-point array, that eliminates selector devices and separate read and write word lines.

SUMMARY

An electro-mechanical diode memory cell for compact ($4F^2$) non-volatile cross-point memory arrays is described. The electro-mechanical diode memory cell operates with relatively low set/reset voltages, provides excellent retention characteristics, and has endurance exceeding ten thousand cycles. Therefore, an electro-mechanical diode memory array can provide high density storage with significant advantages compared to conventional flash memory technology.

A non-volatile memory cell array can include a plurality of substantially parallel bit lines and a plurality of substantially parallel word lines oriented substantially orthogonally in relation to the bit lines. The word lines span the bit lines at a plurality of cross-points, each cross-point establishing a memory cell. Each memory cell is configured to transition from an open-circuit state to a diode state in response to a first voltage pulse with a first polarity applied across its corresponding cross-point. Each memory cell is further configured to transition from the diode state to the open-circuit state in response to a second voltage pulse with a second polarity opposite to the first polarity applied across its corresponding cross-point.

Notably, there is no physical contact between the word line and the bit line at the cross-point when the memory cell is in the open-circuit state. In contrast, there is physical contact between the word line and the bit line at the cross-point defining a memory cell when the memory cell is in the diode state. A current rectifying effect is exhibited in the diode state.

In one embodiment, each bit line can include an n-type semiconductor material, and each word line can include a p-type semiconductor material. In another embodiment, each bit line can include a stack including an n-type polysilicon, a heavily-doped n-type silicon, and a metal, and each word line can include a heavily-doped p-type polysilicon. In yet another embodiment, each bit line can include an n-type semiconductor material, and each word line can include a high work function metallic material. In yet another embodiment, each bit line can include a stack including an n-type polysilicon, a heavily-doped n-type silicon, and a metal, and each word line can include a high work function metallic material. In yet another embodiment, each bit line can include a p-type semiconductor material, and each word line can include an n-type semiconductor material. In yet another embodiment, each bit line can include a stack including a p-type polysilicon, a heavily-doped p-type silicon, and a metal, and each word line can include a heavily-doped n-type polysilicon. In yet another embodiment, each bit line can include a p-type semiconductor material, and each word line can include a low work function metallic material. In yet another embodiment, each bit line can include a stack including a p-type polysilicon, a heavily-doped p-type silicon, and a metal, and each word line can include a low work function metallic material.

In one embodiment, the non-volatile memory cell array can further include multiple planes formed parallel to one another. Each plane can include the plurality of substantially parallel bit lines and the plurality of substantially parallel word lines as described above. The multiple planes form a three-dimensional (3D) memory cell array.

In one embodiment, at each cross-point, the bit and word lines have thin oxide coatings forming a coated bit line and a coated word line. In this embodiment, there is no physical contact between the coated word line and the coated bit line at the cross-point when the memory cell is in the open-circuit state. In contrast, there is physical contact between the coated word line and the coated bit line at the cross-point when the memory cell is in the diode state. A current rectifying effect is still exhibited in the diode state.

A method of fabricating an array of electro-mechanical diode memory cells is also described. This method includes forming a plurality of layers on a substrate. The plurality of layers can include an insulating oxide layer, a first material layer, and a sacrificial oxide layer. Bit lines can be formed by patterning the plurality of layers using a first reactive ion etch (RIE). An isolation layer can be deposited on the bit lines and any exposed substrate. At this point, spacers can be formed from the isolation layer using a second RIE. These spacers are formed on sidewalls of the bit lines.

A second material layer can be deposited on the bit lines, spacers, and any exposed insulating oxide layer. Word lines can be formed from the second material layer using a third RIE. The word lines are formed perpendicular to the bit lines. Each location of a word line crossing a bit line establishes a memory cell. Any sacrificial oxide can be removed from above the bit lines, thereby creating air gaps between the second material layer and the first material layer. This configuration allows the second material layer at each cross-point to form a bendable member (beam). In a set state of a memory cell, the second material layer contacts the first material layer at its corresponding cross-point. In a reset state of the memory cell, the second material layer does not contact the first material layer at the corresponding cross-point. The method can further include forming a three-dimensional (3D) memory cell array. This 3D memory cell array includes a plurality of planes, each plane formed by sequentially depositing bit line stacks, each comprising an isolation layer and a first material layer, then using a first multi-step RIE to pattern the multi-layered stack into bit lines, then depositing a second material layer over the patterned bit lines and isolation layers and any exposed insulating oxide layer, and forming word lines from the second material layer using a third RIE.

In one embodiment, the substrate is a silicon wafer, and the first material can include an n-type polysilicon layer deposited to approximately 100 nm thickness. The insulating oxide layer can include aluminum oxide deposited to approximately 100 nm thickness. The sacrificial oxide can include silicon dioxide or another low-temperature oxide deposited to approximately 30 nm thickness or thinner. The isolation layer can comprise silicon-nitride deposited by chemical vapor deposition. The second material layer can include polycrystalline silicon-germanium deposited to approximately 100 nm thickness or thinner. The removal of the sacrificial oxide from the bit lines can be performed using hydrogen fluoride vapor. In one embodiment, the plurality of layers further include a metallic material layer and a heavily-doped polysilicon layer formed between the insulating oxide layer and the n-type polysilicon layer.

In one embodiment, an oxide coating can be formed on the bendable member and/or the first material layer at each cross-point, thereby forming a coated bendable member and/or a coated first material layer. In a set state of a memory cell, the coated bendable member contacts the coated first material layer at its corresponding cross-point. In a reset state of the memory cell, the coated bendable member does not contact the coated first material layer at the corresponding cross-point.

BRIEF DESCRIPTION OF THE DRAWINGS

The electro-mechanical diode memory cell structure and fabrication will be more fully understood by reference to the following drawings which are for illustrative purposes only.

DETAILED DESCRIPTION OF THE DRAWINGS

An electro-mechanical diode memory cell for compact ($4F^2$) non-volatile cross-point memory arrays is described. The electro-mechanical diode memory cells operate with relatively low set/reset voltages, provide excellent retention characteristics, and have high endurance. Therefore, this memory cell design can provide high density storage with significant advantages compared to conventional flash memory technology.

Figure 1:
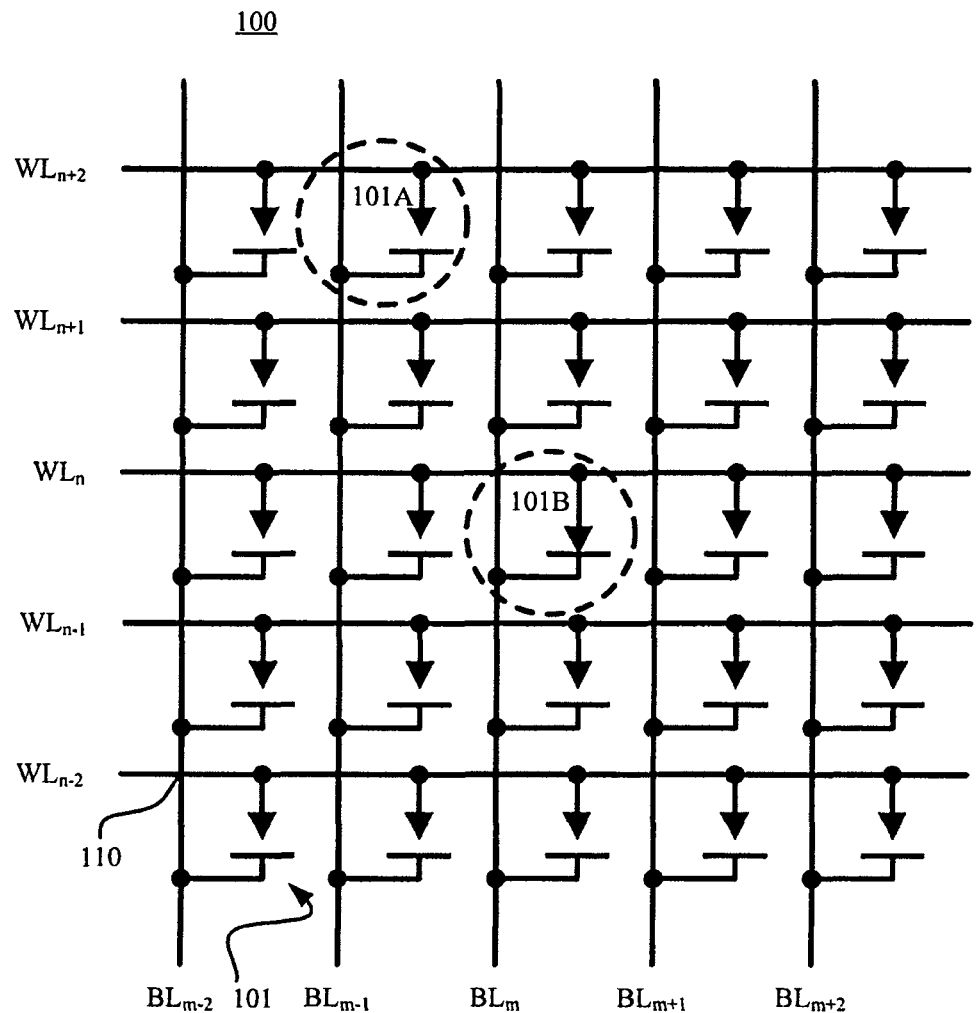
FIG. 1 is a circuit schematic for a 5×5 array of electro-mechanical diode memory cells, wherein the center cell is in the Set state and every other cell is in the Reset state.

An electro-mechanical diode memory cell array can be formed using a plurality of bit lines and a plurality of word lines oriented substantially orthogonally in relation to the bit lines. FIG. 1 is a circuit schematic for an exemplary electro-mechanical diode memory cell array 100. In this embodiment, a 5×5 array is shown with word lines $WL_{n-2}$-$WL_{n+2}$ and bit lines $BL_{n-2}$-$BL_{n+2}$. In other embodiments, any number of word lines and bit lines can be used to form a square or rectangular memory cell array. The word lines WL span the bit lines BL at a plurality of cross-points 110 (one labeled). Notably, each cross-point 110 establishes an electro-mechanical diode memory cell 101 (one labeled).

In array 100, a memory cell is in an open-circuit state, also called a Reset state herein, when there is no physical contact between the word line and the bit line at the cross-point defining the memory cell. For example, memory cell 101A is in a Reset state. In contrast, a memory cell is in a diode state, also called a Set state herein, when there is physical contact between the word line and the bit line at the cross-point defining the memory cell. For example, memory cell 101B is in a Set state.

As described in further detail below, as fabricated, each word line WL is electrically isolated from the bit lines BL by an air gap (i.e. it is suspended over the bit lines). A word line WL can be brought into physical contact with a bit line BL by applying a sufficient differential voltage pulse to "Set" the memory cell. In this Set state, the memory cell comprises a diode that exhibits current rectifying behavior, i.e. the current flows more easily in one direction than in the other direction. In one embodiment, the electro-mechanical diode memory cell comprises a semiconductor p-n junction diode in the Set state.

Figure 2A:
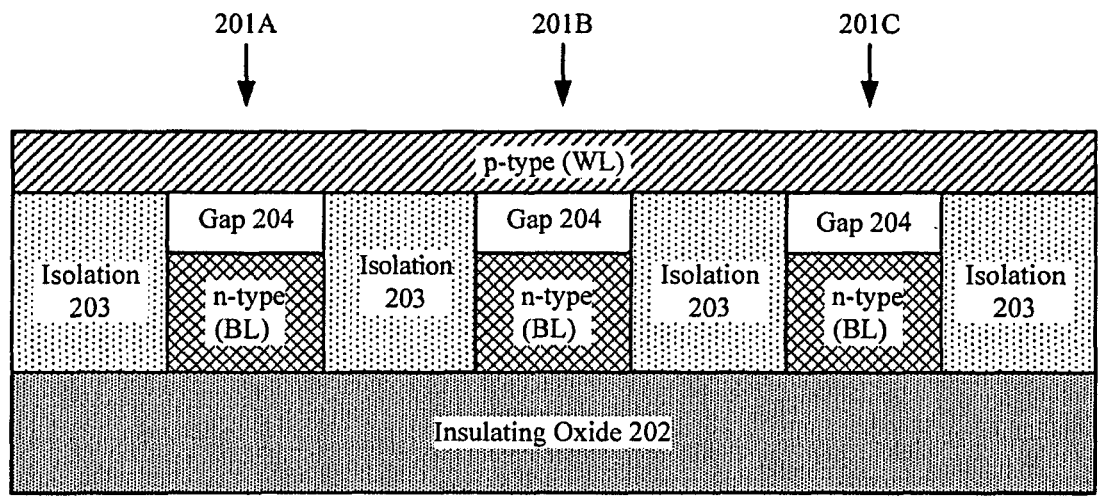
FIG. 2A is a schematic cross-sectional view of three electro-mechanical diode memory cells along a word line, wherein each memory cell is in a Reset state.

FIG. 2A is a schematic cross-sectional view of three electro-mechanical diode memory cells 201A-201C along a word line WL. In this embodiment, electro-mechanical diode memory cells 201A-201C are formed on an insulating oxide layer 202 and separated by a patterned isolation layer 203. As shown in FIG. 2A, the bit line BL associated with each memory cell is separated from word line WL by an air gap (hereinafter gap) 204. Therefore, memory cells 201A-201C are in an open-circuit state, i.e. the Reset state.

Figure 2B:
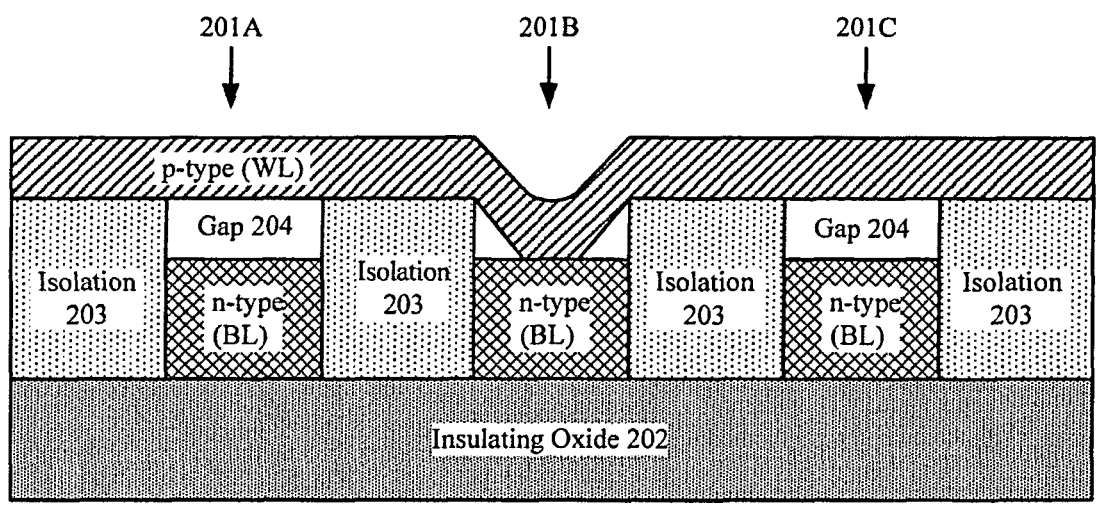
FIG. 2B is a schematic cross-sectional view of three electro-mechanical diode memory cells along a word line, wherein the middle memory cell is in a Set state and the outer memory cells are in the Reset state.

FIG. 2B is a schematic cross-sectional view of the same three electro-mechanical diode memory cells 201A-201C. However, the bit line BL associated with memory cell 201B is in physical contact with word line WL. In contrast, memory cells 201A and 201C have their respective bit lines still separated from word line WL by gaps 204. Therefore, memory cells 201A and 201C are in the Reset state, whereas memory cell 201B is in the diode state, i.e. the Set state.

Figure 2C:
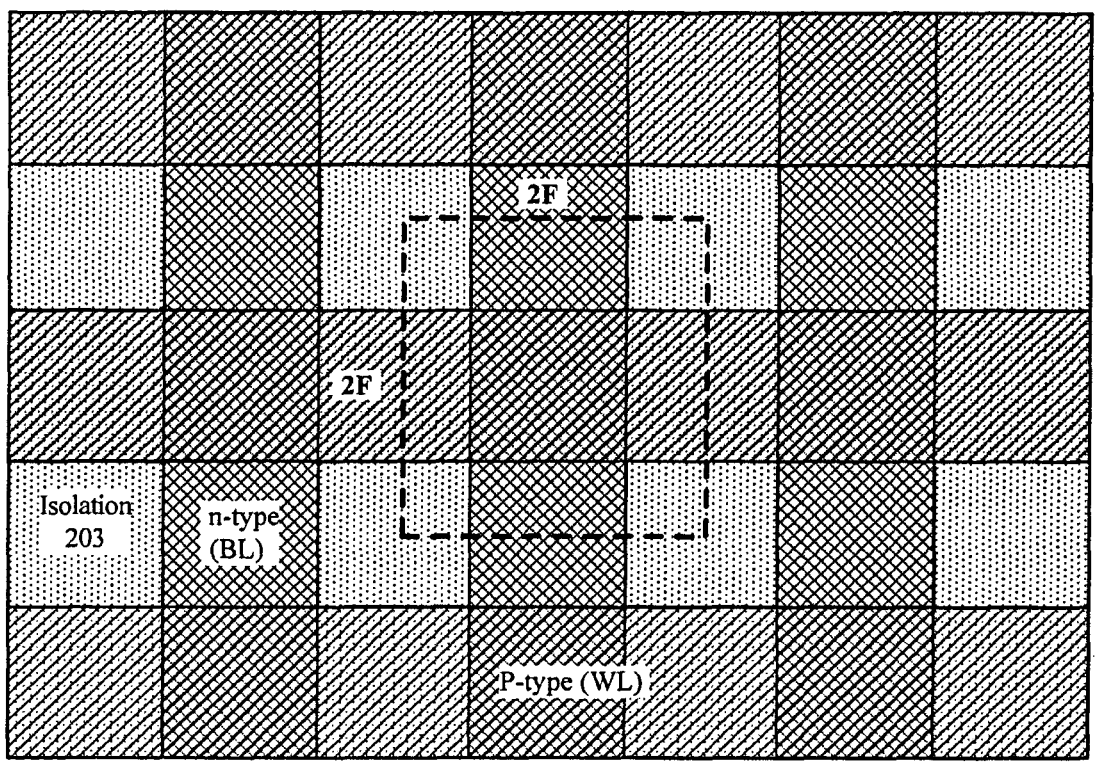
FIG. 2C is a schematic plan view of a 3×3 array of electro-mechanical diode memory cells.

FIG. 2C is a schematic plan view of a 3×3 array 200 of electro-mechanical diode memory cells. To form an array of electro-mechanical diode memory cells, parallel bit lines BL are formed in a conductive layer comprising semiconductor material. In one embodiment, bit lines BL can be formed from n-type semiconductor material. Parallel word lines WL can be formed in a separate conductive layer, which may comprise semiconductor material, in a direction that is substantially orthogonal to that of the bit lines BL, thereby resulting in the cross-point memory array. In one embodiment, word lines WL can be formed from p-type semiconductor material. Isolation 203 is shown in FIG. 2C for context. Notably, this grid configuration for array 200 can achieve the most efficient cell layout area of $4F^2$ (2F×2F), where F is the minimum half-pitch of the word lines WL and the bit lines BL.

Figure 3A:
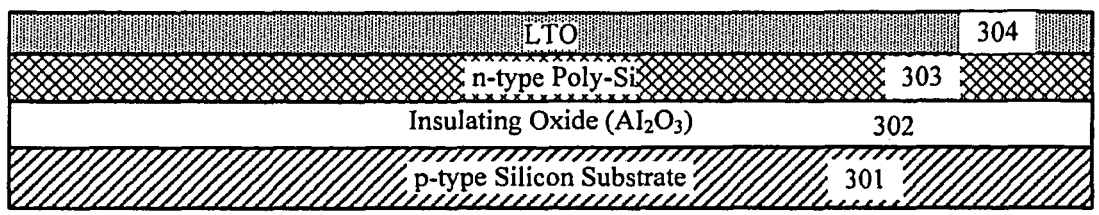
FIGS. 3A-3F illustrate three electro-mechanical diode memory cells along a word line at various steps during an exemplary fabrication process.

FIGS. 3A-3F illustrate an exemplary process used to fabricate the electro-mechanical diode memory cells. FIG. 3A illustrates an exemplary initial layering of materials including a p-type silicon substrate 301, an insulating oxide layer 302, an n-type polycrystalline silicon (polysilicon) layer 303, and a sacrificial oxide layer 304. In one embodiment, the insulating oxide (e.g. aluminum oxide $Al_2O_3$) (for layer 302) can be deposited to approximately 100 nm thickness on a p-type silicon wafer (forming layer 301). The n-type polysilicon (layer 303) can be deposited (to approximately 100 nm thickness on layer 302. The sacrificial $SiO_2$ (low-temperature oxide, LTO)(layer 304) can be deposited on layer 303 to approximately 30 nm thickness or thinner.

Figure 3B:
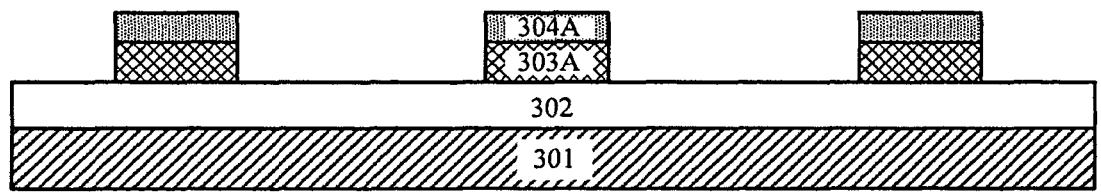
Figure 3C:
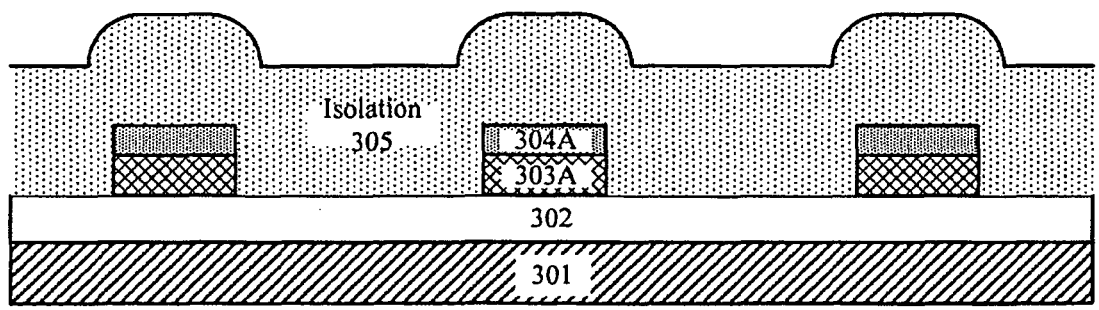
Figure 3D:
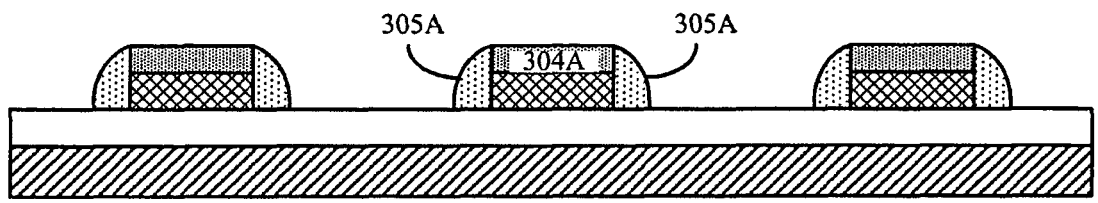
Figure 3E:
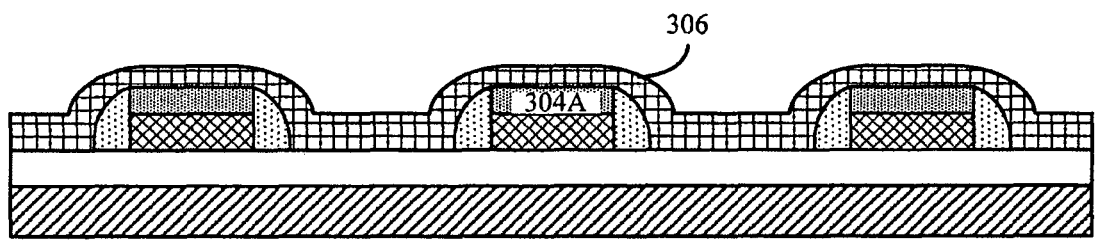
Figure 3F:
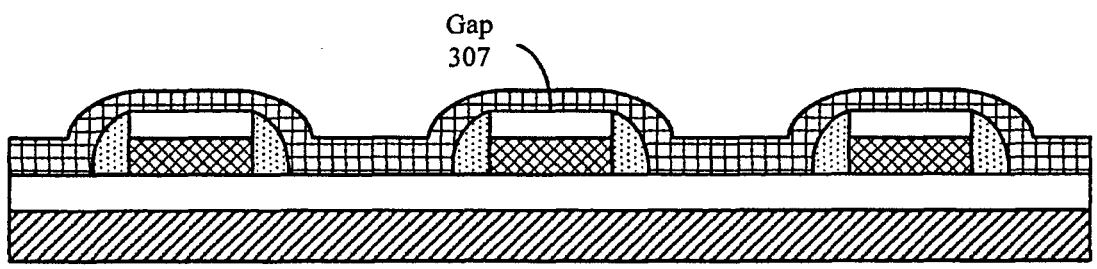

FIG. 3B illustrates the formation of the bit lines using reactive ion etch (RIE) processes (anisotropic etching) to form patterned n-type polysilicon layer 303A and patterned sacrificial oxide layer 304A. FIG. 3C illustrates the deposition of an isolation silicon-nitride ($SiN_x$) layer 305 to a thickness of approximately 130-140 nm. In one embodiment, this deposition can be done using chemical vapor deposition. FIG. 3D illustrates the formation of $SiN_X$ spacers 305A using RIE processes (anisotropic etching). FIG. 3E illustrates the deposition of a p-type semiconductor (e.g. silicon germanium, $Si_{0.4}Ge_{0.6}$) layer 306 to approximately 100 nm thickness. Standard lithography and RIE (anisotropic etching) can be used to form the word lines from layer 306 (one shown in FIG. 3E). FIG. 3F illustrates the selective removal of the patterned sacrificial layer 304A, which can be performed using hydrogen fluoride (HF) vapor, to form gaps 307. After this selective removal, spacers 305A provide support to maintain the integrity of gaps 307. Note that these spacers are shown as isolation blocks in the other drawings for simplicity.

Figure 4:
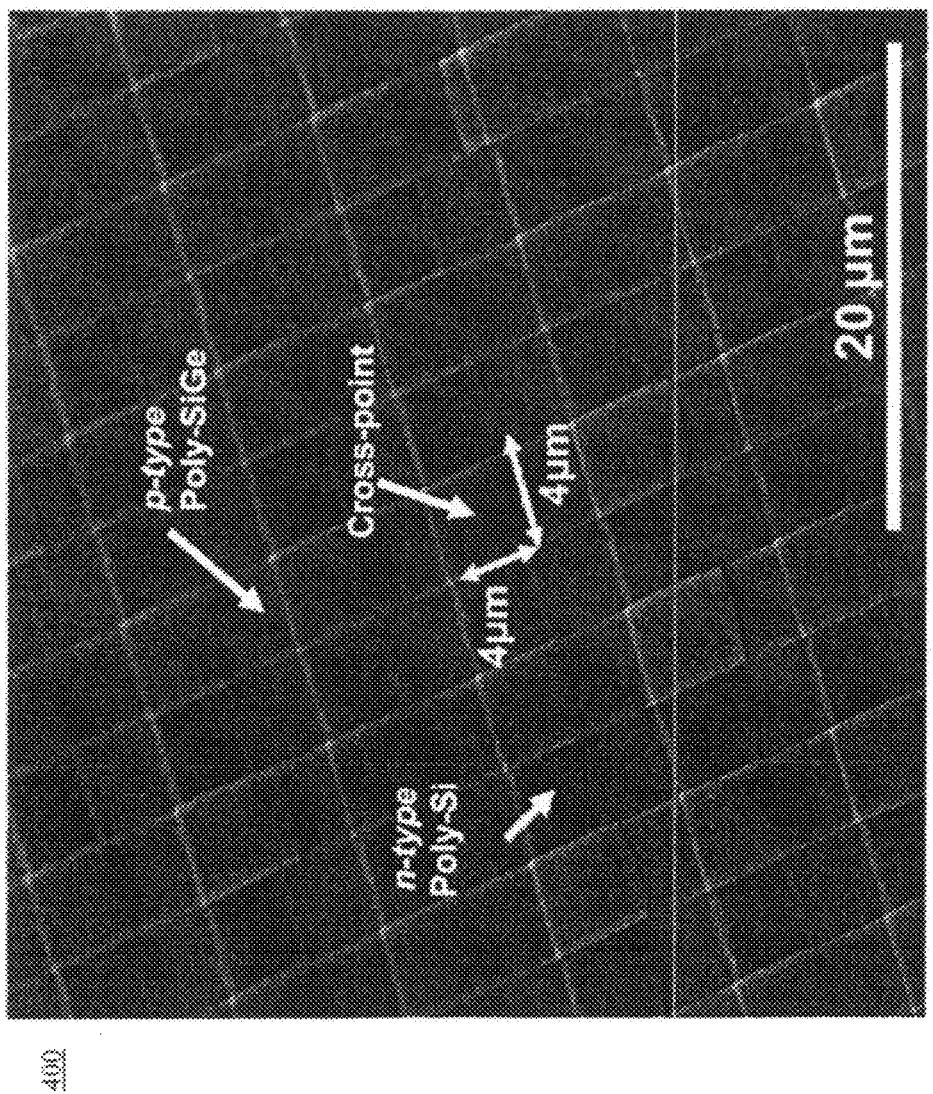
FIG. 4 is a scanning electron micrograph of a fabricated electro-mechanical diode cross-point memory array.
Figure 5:
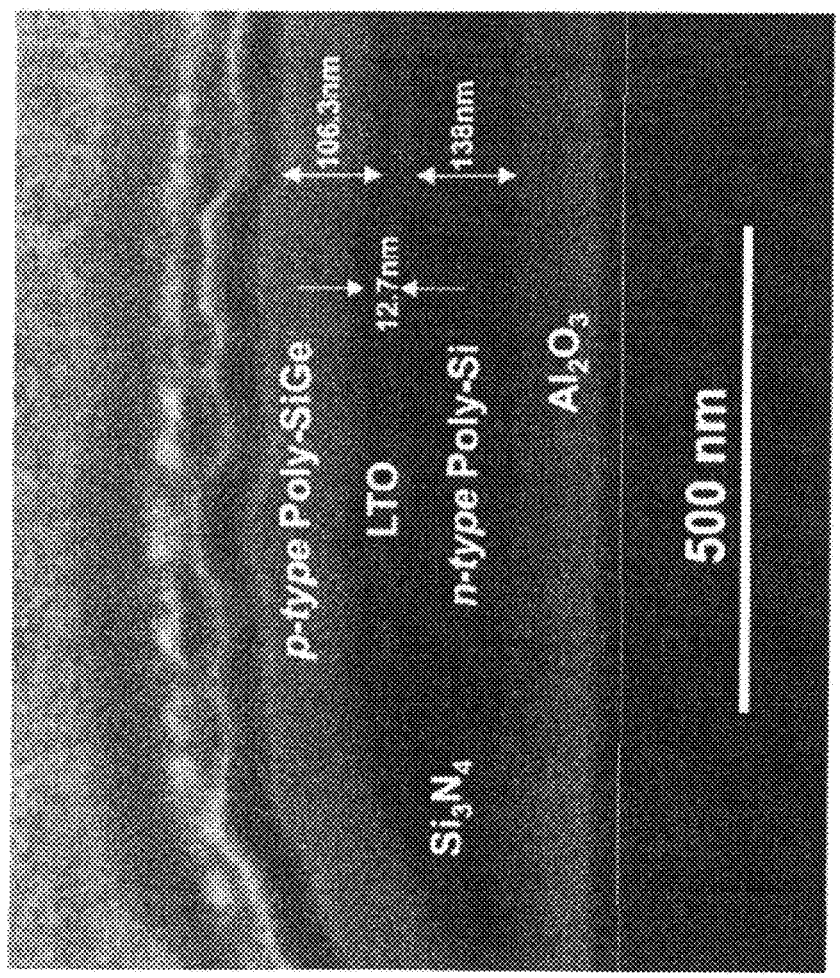
FIG. 5 is a cross-sectional scanning electron micrograph along the word line of a fabricated electro-mechanical diode cross-point memory array.

FIG. 4 illustrates a scanning electron microscopy (SEM) image 400 of a prototype electro-mechanical diode memory cell array. FIG. 5 illustrates a scanning electron microscopy (SEM) image 500 of an electro-mechanical diode memory cell before selective removal of the sacrificial oxide (LTO). In the memory cell shown in FIG. 5, the air-gap thickness between the bit line (n-type poly-Si) and the word line (p-type poly-$Si_{0.4}Ge_{0.6}$) that results from selective removal of the LTO is approximately 13 nm.

The bias conditions (voltages) used to perform Set, Reset, and Read operations of the prototype electro-mechanical diode memory cells are listed in Table I below:

TABLE I

|  | Set | Reset | Read |
|---|---|---|---|
| Selected WL voltage | 0 V | 0 V | 1.2 v |
| Selected BL voltage | 8-10 V | −7 V | 0 V |
| Non-selected WL voltage | 5 V or open circuit | −3 V or open circuit | 0 V |
| Non-selected BL voltage | 0 V | 0 V | Open circuit |
| Voltage pulse width | <10 μs | Approx 100 ms | <10 μs |

Note that as fabricated (and shown in FIG. 3F), all of the electro-mechanical diode memory cells are in the Reset (open circuit) state.

Figure 6A:
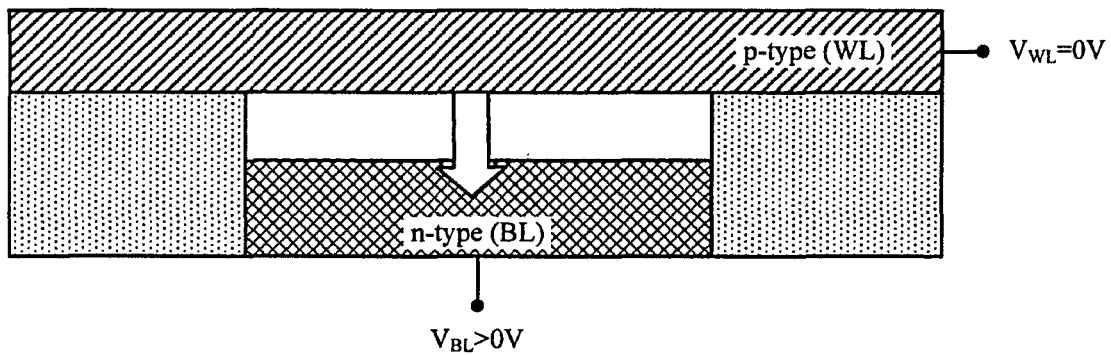
FIGS. 6A and 6B illustrate a Set process for an electro-mechanical diode memory cell.
Figure 6B:
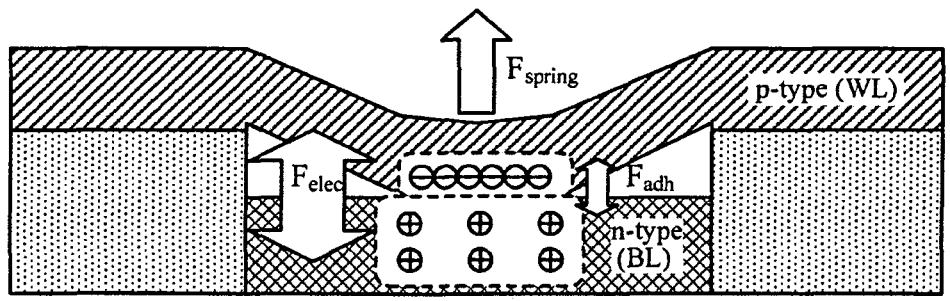
Figures 7A, 7B:
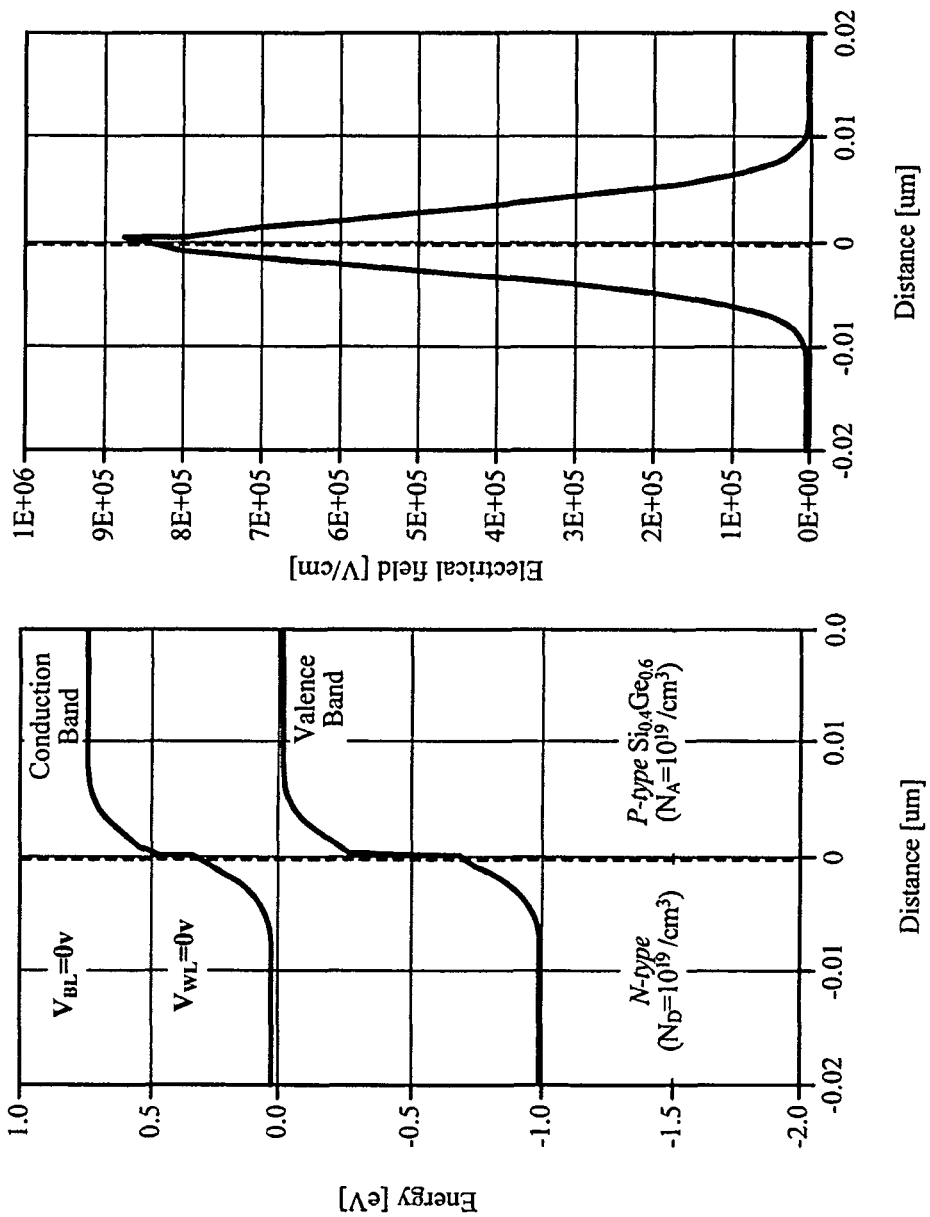
FIGS. 7A and 7B illustrate an electron energy band diagram and the corresponding electric field distribution within a semiconductor p-n junction.

FIGS. 6A and 6B illustrate performing a Set operation. In FIG. 6A, the word line WL can be set to 0V while the bit line BL can be biased at a positive Set voltage. In one embodiment, the positive Set voltage is between approximately 8-10 V. The electrostatic force $F_{elec}$ caused by this biasing is large enough to actuate the word line WL into contact with the bit line BL, thereby forming a p-n diode. Notably, the resultant force exerted by the p-n junction built-in electric field is close to 1 MV/cm. For example, FIGS. 7A and 7B illustrate an exemplary electron energy band diagram and the corresponding electric field distribution within a semiconductor p-n junction. This electric field induced electrostatic force $F_{elec}$ plus the surface adhesion force $F_{adh}$ is sufficient to overcome the spring restoring force $F_{spring}$ of the word line WL (which can be characterized as a beam) (i.e. $F_{elec}+F_{adh}>F_{spring}$). As a result, the Set state can be held when the actuation voltage is removed, as shown in FIG. 6B, thereby providing a non-volatile memory cell.

Note that the bit line BL and the word line WL have different work functions, i.e. different affinity for electrons. Therefore, when the two lines are in contact, electrons will move from one material to another material. Specifically, as shown by FIG. 6B, electrons have moved from the n-type bit line BL to the p-type word line WL, thereby creating a net charge of opposite polarity for each line. This net charge induces the electrostatic force $F_{elec}$. The total number of charges (positive/negative) on either side of the junction is the same; however, the density of charges may differ (as shown) based on the type of materials and/or the doping of the material(s).

Figure 8:
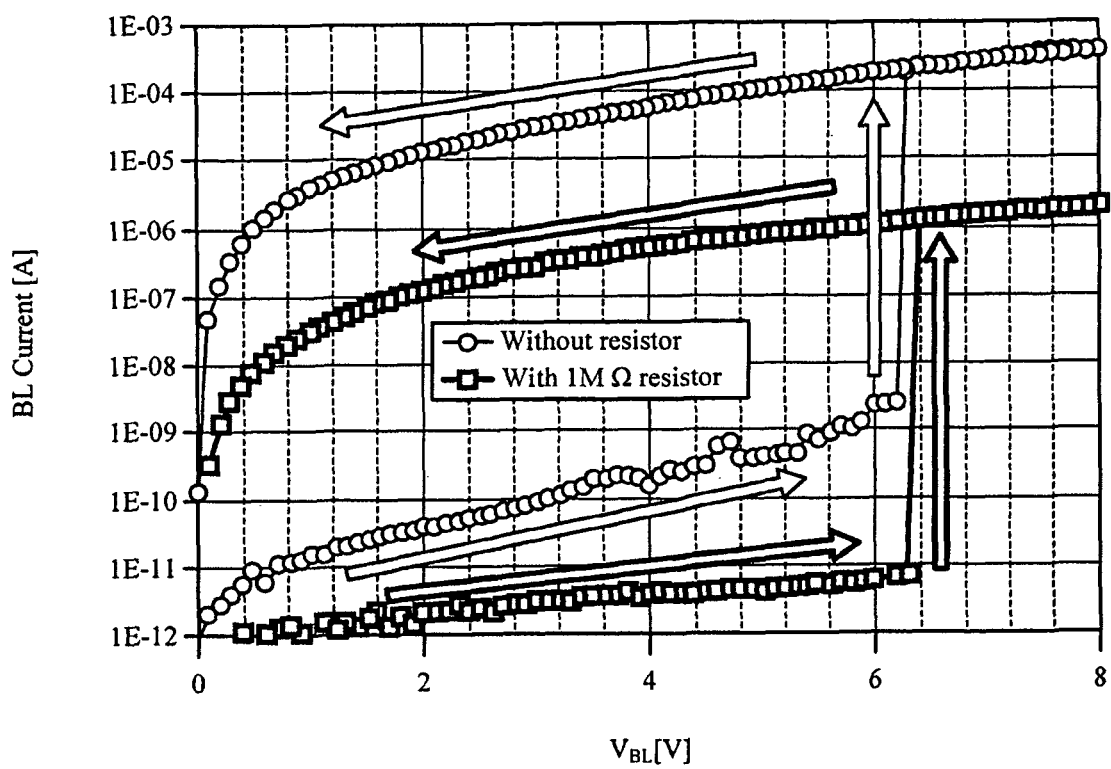
FIG. 8 is a plot of measured bit-line current vs. applied bit-line voltage for an electro-mechanical diode memory cell during the Set operation.

FIG. 8 shows how the bit line current changes during a Set operation (with the arrows indicating progression in time), both with a 1 MOhm resistor and without a resistor connected in series with the voltage source. Note that a sudden increase in current at the pull-in voltage (in this case, 6.2V) is seen when the word line WL is pulled in to contact the bit line BL. Because an applied differential voltage (not current) is required to actuate the word line WL, the Set current can be lowered by inserting a current-limiting resistance in series with the bit line BL driver to reduce the energy consumed by the Set operation.

Figure 9:
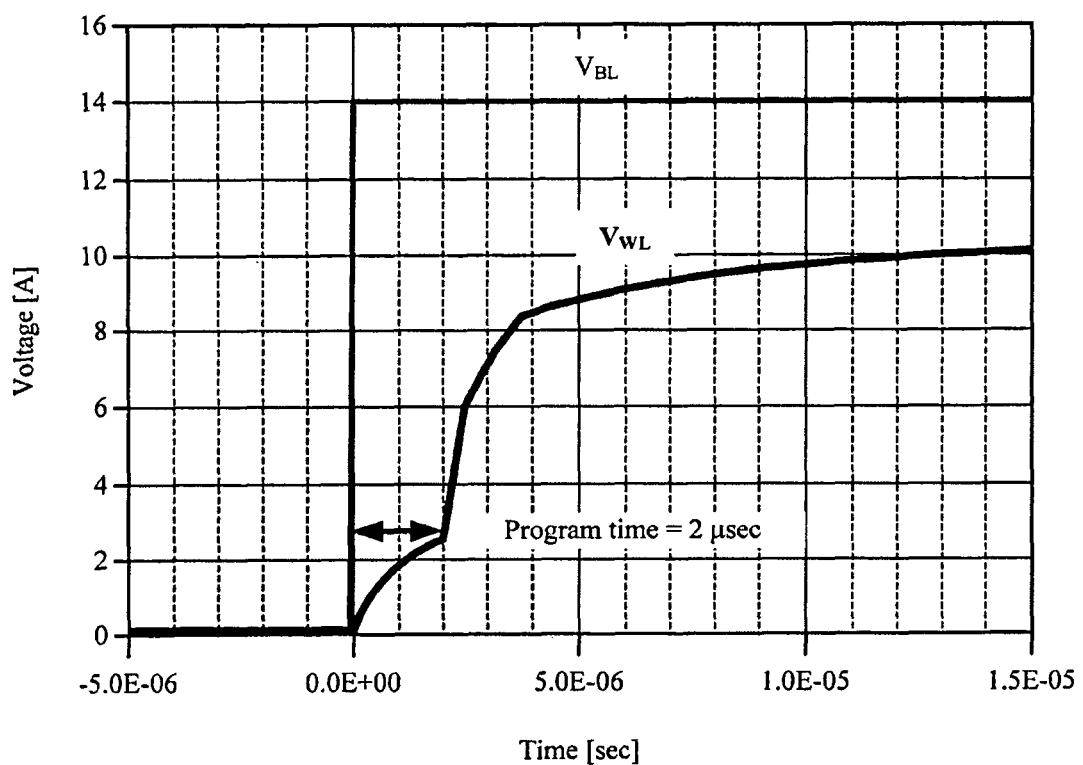
FIG. 9 is a plot of measured bit-line voltage and measured word-line voltage vs. time for an electro-mechanical diode memory cell during an exemplary Set operation.

FIG. 9 shows the transient response of the word line voltage during the Set operation. In this embodiment, the Set (pull-in) voltage is 6.2 V and the Set time is approximately 2 μs for a bit line voltage of 14 V. Note that an applied voltage difference (not current flow) actuates the word line. Therefore, the Set current can be lowered by inserting a current-limiting resistance (e.g. the 1 MOhm resistor) in series with the bit line driver, thereby allowing the energy consumed by the Set operation to be reduced.

The state of an electro-mechanical diode memory cell can be determined by sensing the bit line current when a Read voltage is applied between the memory cell's word and bit lines. If the Read voltage is applied to an electro-mechanical diode memory cell in its Reset state, then substantially no current flows through the memory cell. More particularly, only leakage current may flow through parasitic paths. In contrast, if the Read voltage is applied to an electro-mechanical diode memory cell in its Set state, then a much larger forward diode current flows through the memory cell.

Figure 10:
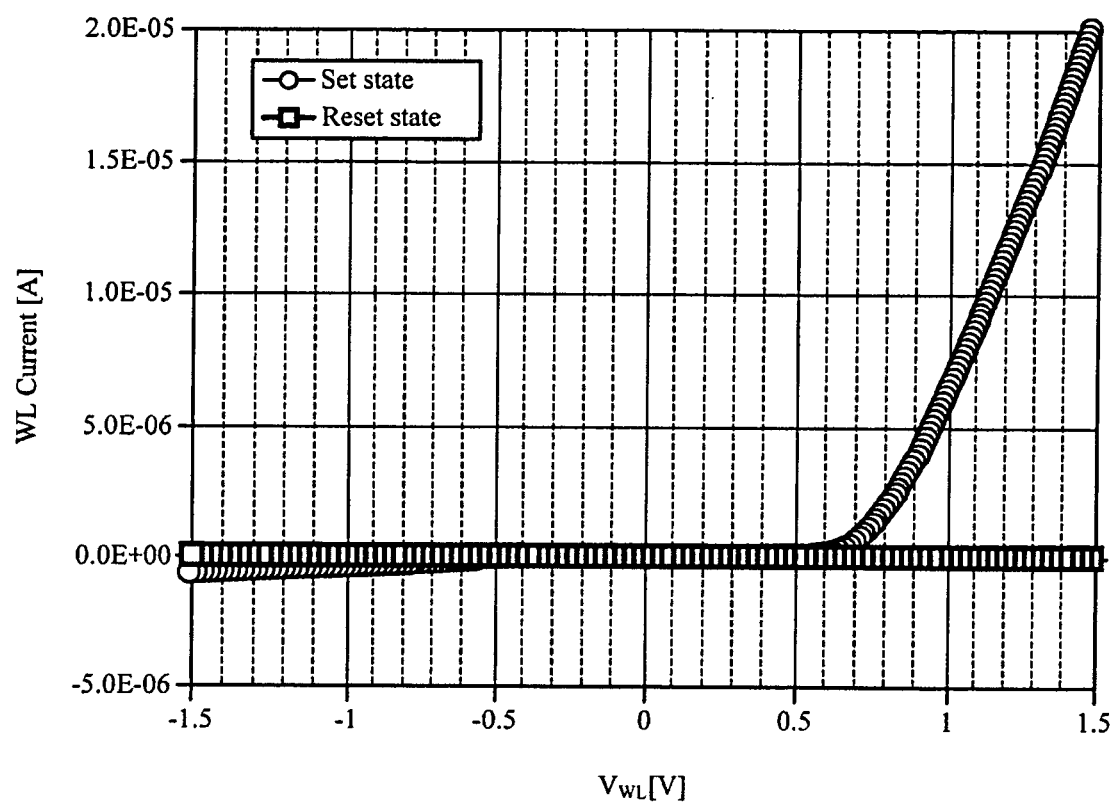
FIG. 10 is a linear plot of measured word-line current vs. applied word-line voltage for an electro-mechanical diode memory cell during the Read operation.
Figure 11:
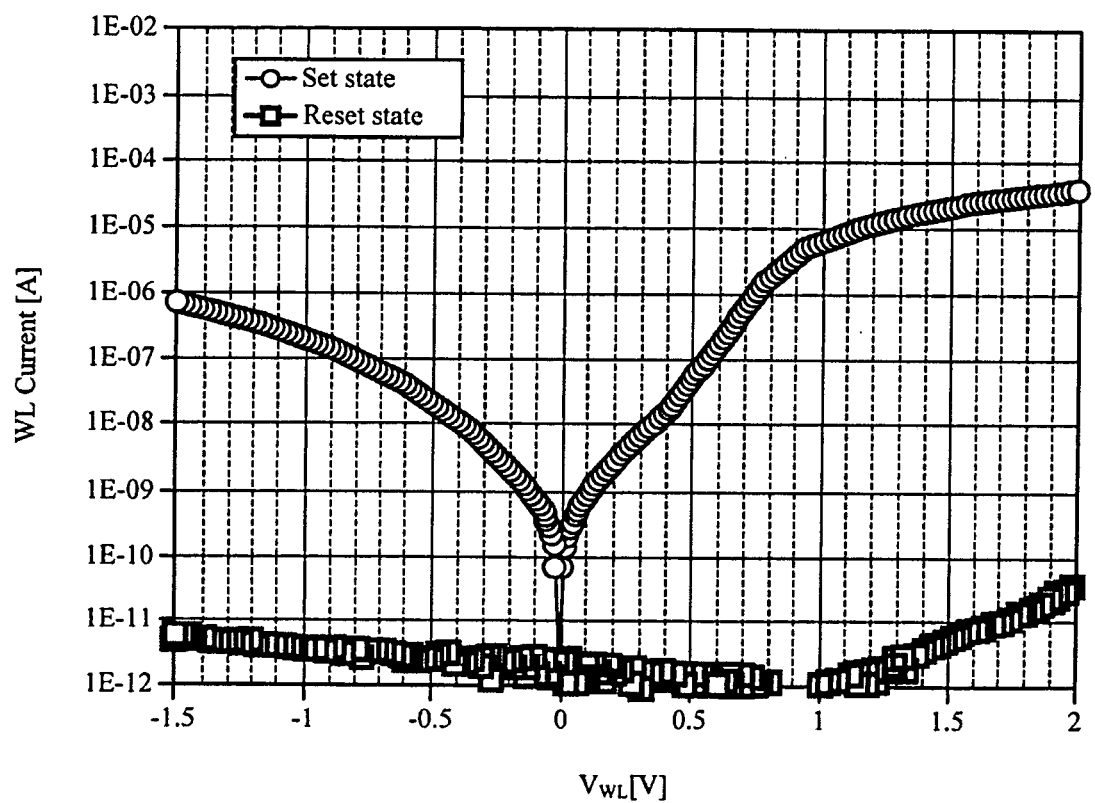
FIG. 11 is a logarithmic plot of measured word-line current vs. applied word-line voltage for electro-mechanical diode memory cells.

FIG. 10 is a linear plot of measured word-line current vs. applied word-line voltage for an electro-mechanical diode memory cell (in Set and Reset states) during the Read operation. FIG. 11 is a logarithmic plot of measured word-line current vs. applied word-line voltage for an electro-mechanical diode memory cell in the Set and Reset states. FIG. 11 indicates a very high Set/Reset current ratio ($>10^6$) can be achieved by the electro-mechanical diode memory cell. Note that FIGS. 10 and 11 show the same data; however, the logarithmic scale used in FIG. 11 allows the ratio of the forward-bias current to the reverse-bias current in the Set state to be seen more clearly.

One requirement for implementation of a commercially viable cross-point memory array is the suppression of large "sneak" leakage currents through unselected cells in the memory array during a Read operation, as these currents can cumulatively result in a sufficiently high current (i.e. in the range corresponding to a Set cell) to result in an erroneous Read operation. Therefore, the size of the cross-point memory array is limited by the ratio of the selected Set memory cell current to the sneak leakage current through an unselected Set memory cell during a Read operation; the larger this ratio, the more word lines WLs and/or bit lines BLs there can be in the array.

Figure 12:
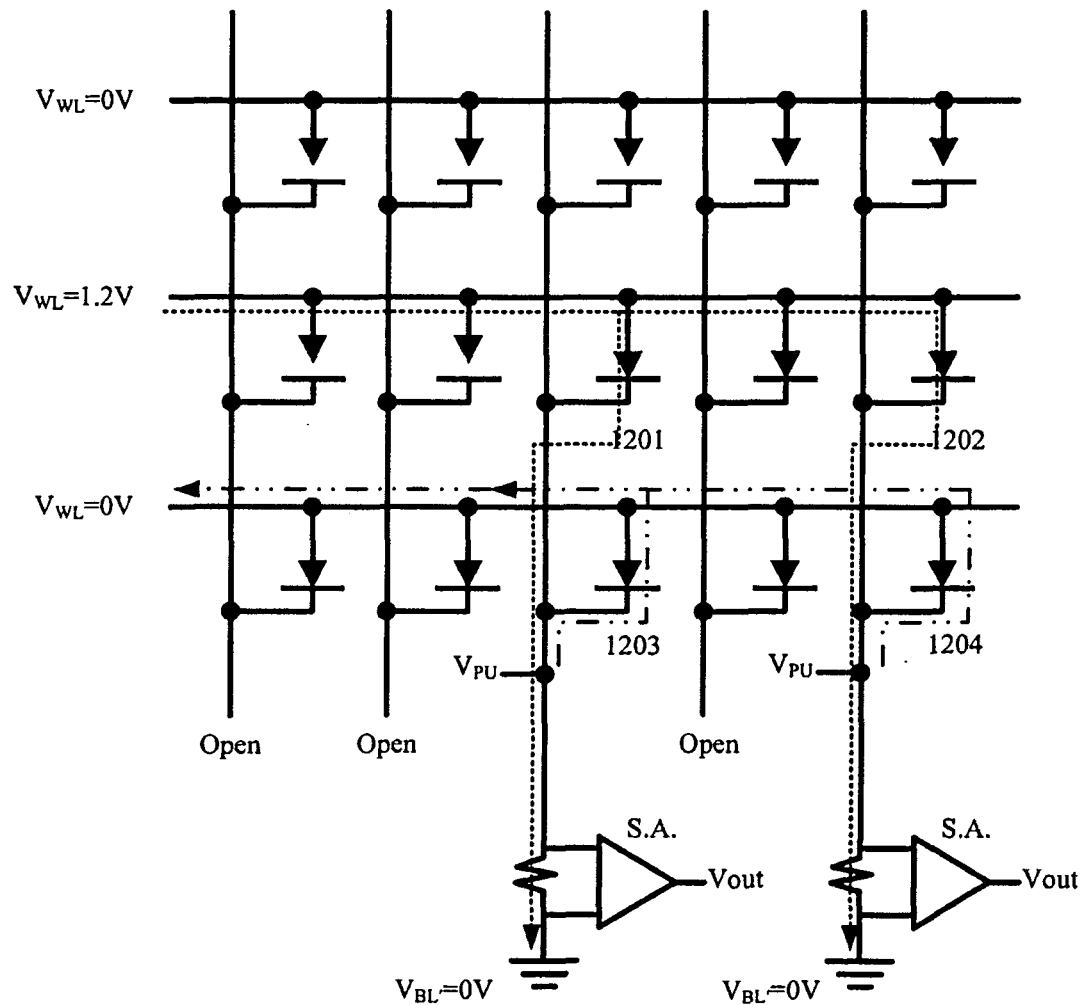
FIG. 12 is a circuit schematic for a 3×5 array of electro-mechanical diode memory cells indicating current flow during an exemplary Read operation.

FIG. 12 illustrates possible sneak current paths during a parallel Read operation of memory cells 1201 and 1202. Note that the bias conditions (conforming to Table I above) for this Read operation include providing a Read voltage (e.g. 1.2V) on the word line associated with the two memory cells and providing 0V on the other word lines. The selected bit lines, i.e. the bit lines associated with memory cells 1201 and 1202, are coupled to sense amplifiers (S.A.) in the configuration shown. All non-selected bit lines are floating, i.e. open circuit.

In this bias configuration, the sense amplifiers can sense the current flowing in the selected bit lines. However, any unselected memory cells in a Set state on the selected bit line, such as memory cells 1203 and 1204 in FIG. 12, can experience a reverse bias based on the bias configuration, thereby allowing a reverse diode current to flow (the reverse diode current being based on the pull-up voltage $V_{PU}$ which is less than the select voltage (e.g. 1.2V) provided on the selected word line).

The currents flowing through the selected cells 1201 and 1202 (both of which are in a Set state) are denoted by dotted lines, whereas sneak leakage currents through unselected memory cells 1203 and 1204 in the Set state are denoted by dash-double-dot lines. Note that sneak leakage currents correspond to the reverse-bias diode leakage of the unselected memory cell(s) which are in the Set state. The sneak leakage current through these unselected Set memory cells is at most equal to the reverse-bias diode leakage of a memory cell in the Set state, where the magnitude of the reverse bias is approximately equal to the maximum sense-amp input voltage. This is because the bit-line resistance is much smaller than the effective resistance of a forward-biased diode memory cell in the Set state. Thus, the ratio of the Set cell current at a (forward) bias of $V_{WL,READ}$ to the Set cell current at a (reverse) bias of approximately −0.1 Volts, the "rectification ratio," is a parameter of interest for cross-point electro-mechanical memory technologies.

Figure 13:
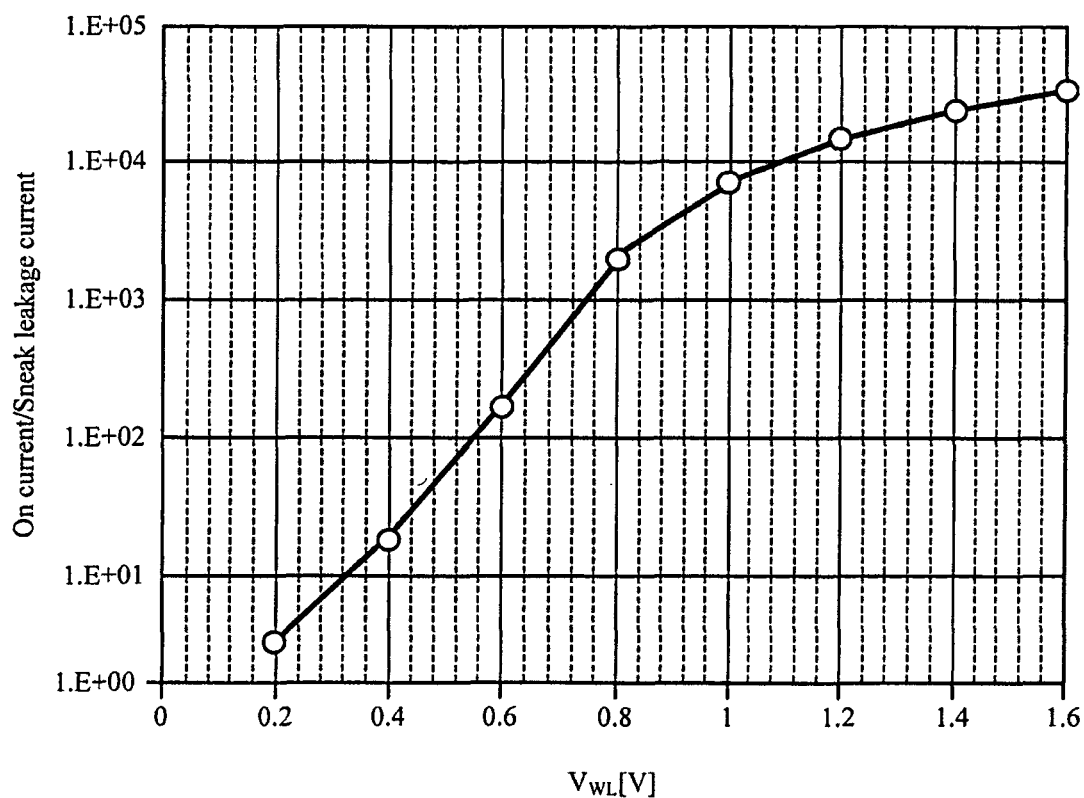
FIG. 13 is a plot of the ratio of Set-cell forward current to Set-cell reverse current, as a function of the Read (word-line) voltage, for an electro-mechanical diode memory cell.

As noted above, any unselected memory cell in a Set state on the selected bit line will divert some current from the sense amplifier (and its associated selected bit line) to its associated (and unselected) word line. FIG. 13 shows the ratio of a selected Set memory cell current to sneak leakage current (the rectification ratio) as a function of $V_{WL}$ during a Read operation, for an exemplary memory cell. For $V_{WL}$=1.2V, the ratio of selected Set cell current to sneak path leakage current is approximately 300, which compares well against that for a 1D-1R (one diode-one resistor) cross-point memory cell. With a rectification ratio of 300, up to 150 unselected word lines of a cross-point array may carry reverse diode current without resulting in an erroneous Read operation. Memory cells with an even higher rectification ratio would allow the memory array to be increased in size, thereby increasing the layout area efficiency of the memory array.

By increasing the work-function difference between the word and bit lines or improving the crystalline quality of the semiconductor materials, this rectification ratio may be improved (i.e. by decreasing the reverse-bias current or increasing the forward-bias diode current). For example, p-type poly-Si has a larger work function than p-type poly-Si$_{0.4}$Ge$_{0.6}$ for the word line material, as shown in Table II (which indicates measured non-volatile memory diode characteristics for different p-type word line materials and post-deposition annealing conditions) below. Additionally, the poly-Si layers can be subjected to thermal annealing to increase the average grain size (also shown in Table II below).

TABLE II

| P-type WL Material | Rectification Ratio |
| --- | --- |
| Poly-Si$_{0.4}$Ge$_{0.6}$ (450° C.) | 8 × 10$^3$ |
| Poly-Si (610° C.) with 950° C., 1 hr anneal | 5 × 10$^4$ |
| Poly-Si (610° C.) with 1050° C., 1 hr anneal | 1 × 10$^7$ |

Figure 14A:
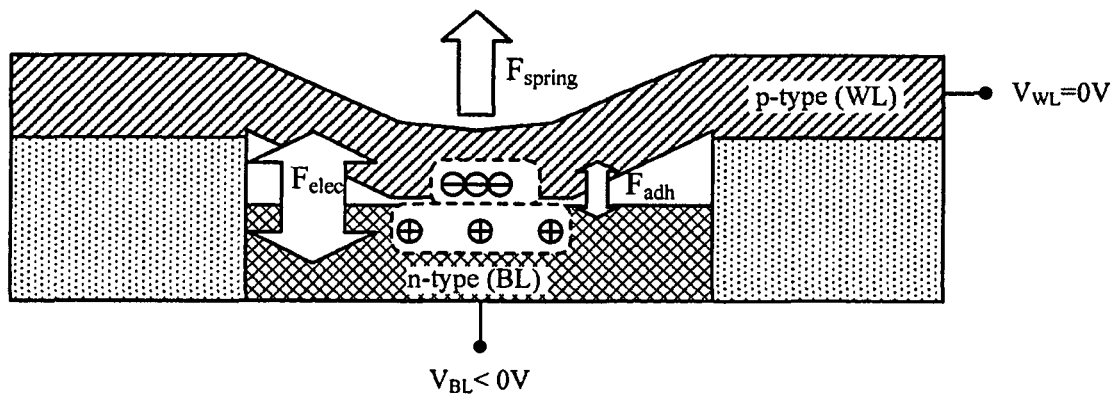
FIGS. 14A and 14B illustrate the Reset process for an electro-mechanical diode memory cell.
Figure 14B:
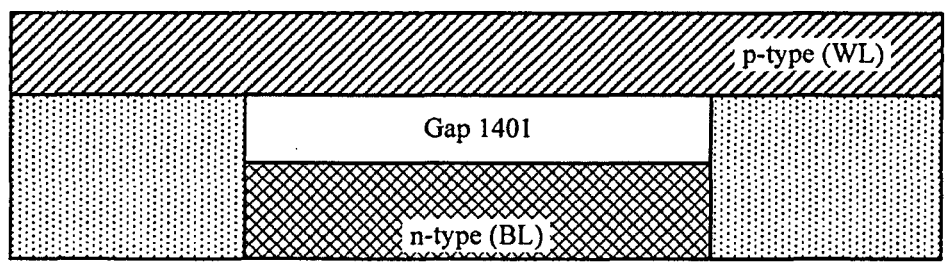

To cause a memory cell to be "erased" into the Reset state (to release the word line from contact with the bit line at the location of the memory cell), a voltage pulse is applied between its word line and its bit line to counteract the built-in electrostatic force $F_{elec}$ of the p-n diode and the surface adhesion force $F_{adh}$, so that the spring restoring force of the beam $F_{spring}$ is sufficient to pull it out of contact) (i.e. electrostatic force $F_{elec}$+adhesion force $F_{adh}$<spring restoring force $F_{spring}$). FIGS. 14A and 14B illustrate an exemplary Reset operation. As shown in FIG. 14A, the word line WL is grounded at 0V while the bit line BL is biased at a negative Reset voltage (e.g. −7V, as shown in Table I). After these bias voltages are applied, the memory cell returns to its Reset state. FIG. 14B shows the memory cell in its Reset state, in which the memory cell has a gap 1401 between its bit line BL and its word line WL.

Figure 15:
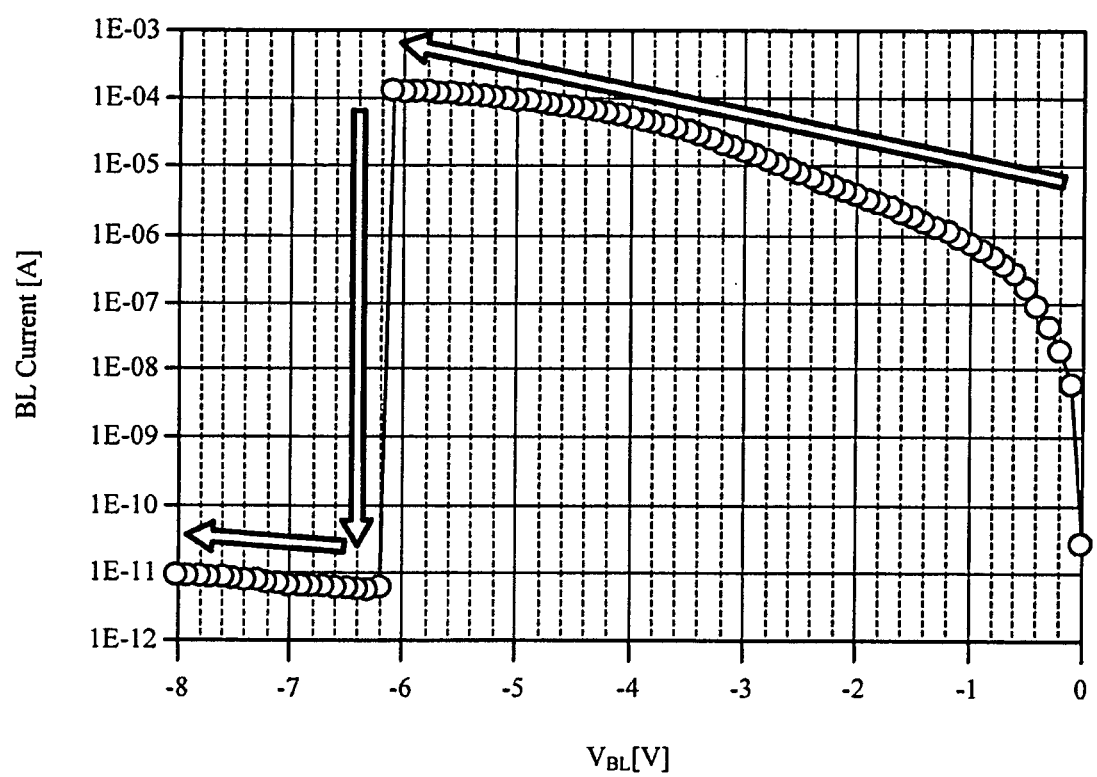
FIG. 15 is a plot of measured bit-line current vs. applied bit-line voltage for an electro-mechanical diode memory cell during an exemplary Reset operation.

FIG. 15 shows how the bit line current changes during a Reset operation for an exemplary electro-mechanical diode memory cell (the arrows indicating time progression). In this embodiment, the Reset (release) voltage is −6.2 V. Note that the memory cell voltage required for Reset is less than the built-in voltage of the diode (typically less than 1 Volt), in principle. Because the diode is forward-biased during a Reset operation, a significant amount of current (~100 μA) flows. As a result, there can be significant voltages dropped across the word line and the bit line. These voltage drops can be reduced by using a metallic word line material and by thickening the bit line or shunting it with a more conductive layer. The Reset voltage thus can be lowered by lowering the resistance of the word line and/or the resistance of the bit line, to reduce the energy consumed by the Reset operation.

Figure 16:
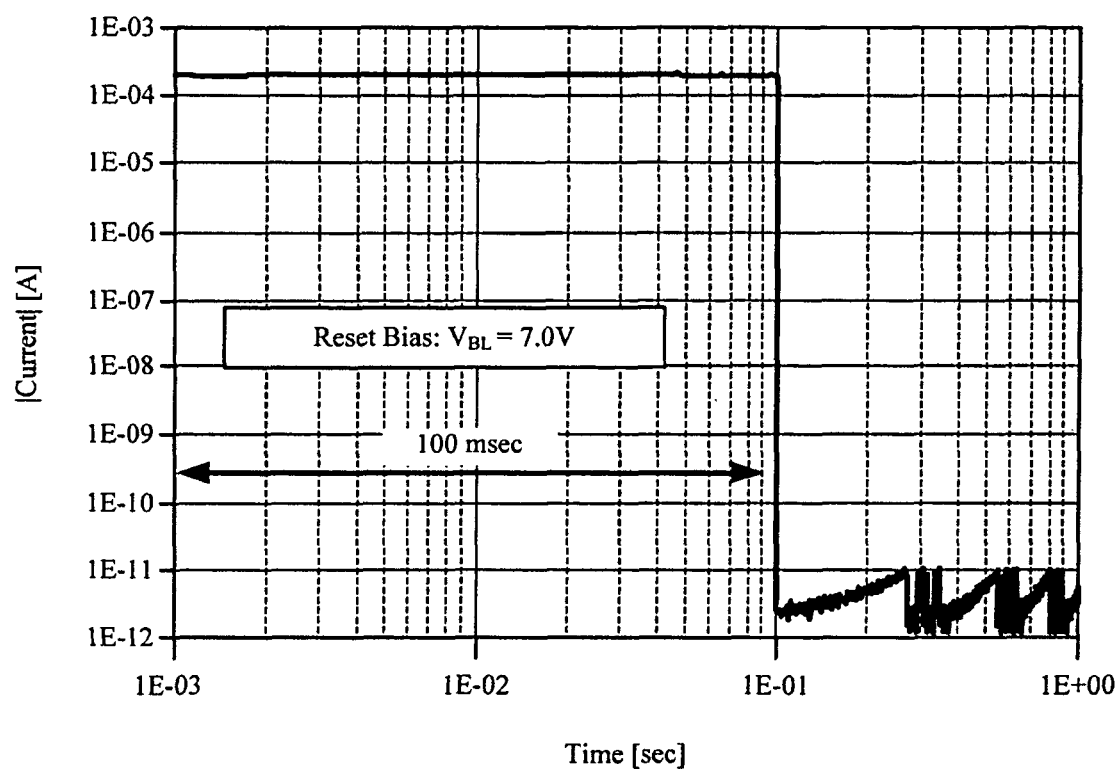
FIG. 16 is a plot of measured bit-line current vs. time during an exemplary Reset operation for an electro-mechanical diode memory cell.
Figure 17:
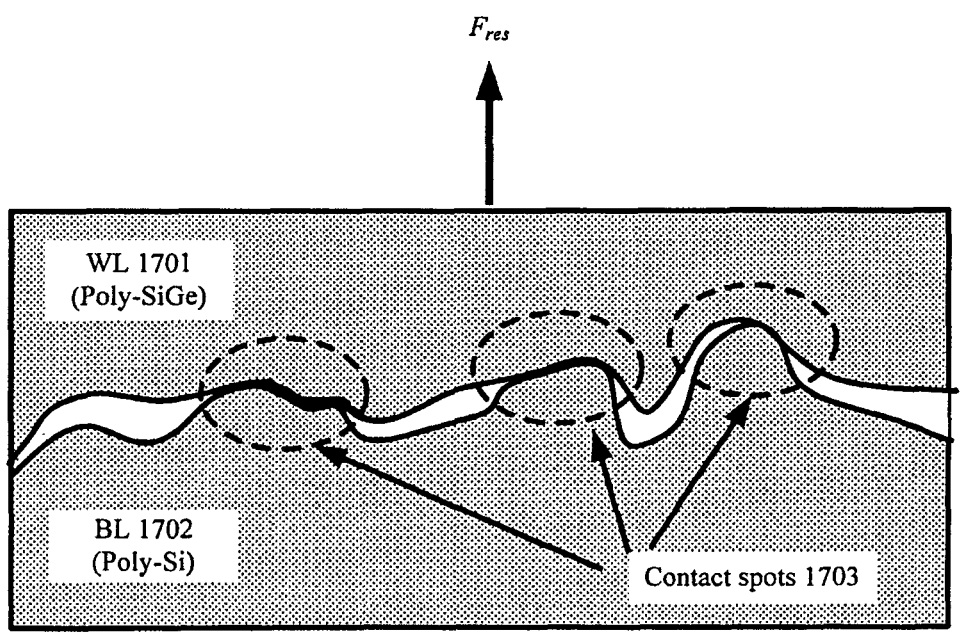
FIG. 17 is a schematic illustration of two contacting surfaces in an electro-mechanical diode.

FIG. 16 shows the transient response of the bit line current for an exemplary electro-mechanical diode cell during a Reset operation. In this embodiment, the Reset time is approximately 100 ms for a bit line voltage $V_{EL}$ of −7 V. The longer reset time (compared to set time) can be explained by the contact opening model presented by B. D. Jensen et al. in Journal of Applied Physics, vol. 97, p. 103535, 2005. For example, as shown in FIG. 17, the spring restoring force of a beam first reduces the number of bonds between the contacting surfaces, i.e. between word line WL 1701 and bit line BL 1702. Only when the number of bonds is sufficiently small does contact opening occur. The contact opening time therefore depends on the number of bonds formed between the contacting surfaces, and can be reduced with scaling (to reduce the contact force and apparent contact area) and/or an appropriate surface treatment. FIG. 17 shows three exemplary contact spots 1703 present in the Set state. When the Reset operation is complete, the WL and BL are separated, i.e. contact spots 1703 will no longer be present.

Figure 18:
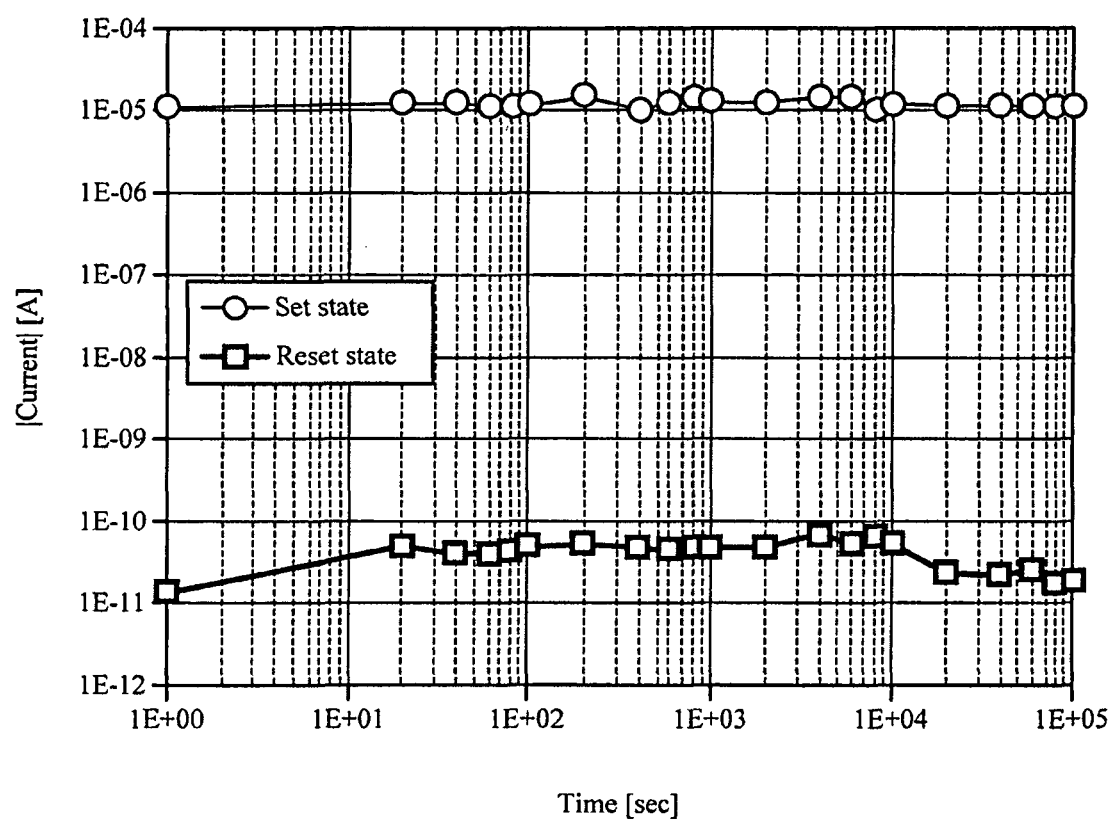
FIG. 18 is a logarithmic plot showing the measured retention behavior of prototype electro-mechanical diode memory cells.

Because electrostatic force and surface adhesion force are present in the Set state, the electro-mechanical diode memory cell can have a very long retention time. FIG. 18 shows measured retention characteristics (using a word line voltage of 1.2V for the Read) for an exemplary electro-mechanical diode memory cell having a device size of 4×4 μm. As shown in FIG. 18, the memory cell exhibits negligible changes in conductance for long periods of time in both the Set and Reset states even at a high temperature of 200° C., which well exceeds the normal operating temperature range for CMOS devices. As the electro-mechanical diode memory cell relies neither on charge storage in a floating-gate/charge-trap layer nor a material phase change to store data, it has more robust retention behavior than other non-volatile memory technologies. For example, at 125° C., a NAND flash memory cell retains its state for approximately 4 days, an ReRAM (resistive RAM) cell retains its state for approximately 2 days, and a PCM (phase-change memory) cell retains its state for less than 1 day (see Table IV below).

A potential reliability concern for mechanical devices is vibration or mechanical shock. However, because of the extremely small mass (3.73 pg for the exemplary memory cell) of the word line beam, a very large acceleration (10$^8$ G) would be needed to accidentally Set a memory cell or to overcome the attraction forces in the Set state (4 μN for an exemplary memory cell) to Reset a cell. This acceleration is far beyond the industry requirement (~20000 G) for automotive applications.

Figure 19:
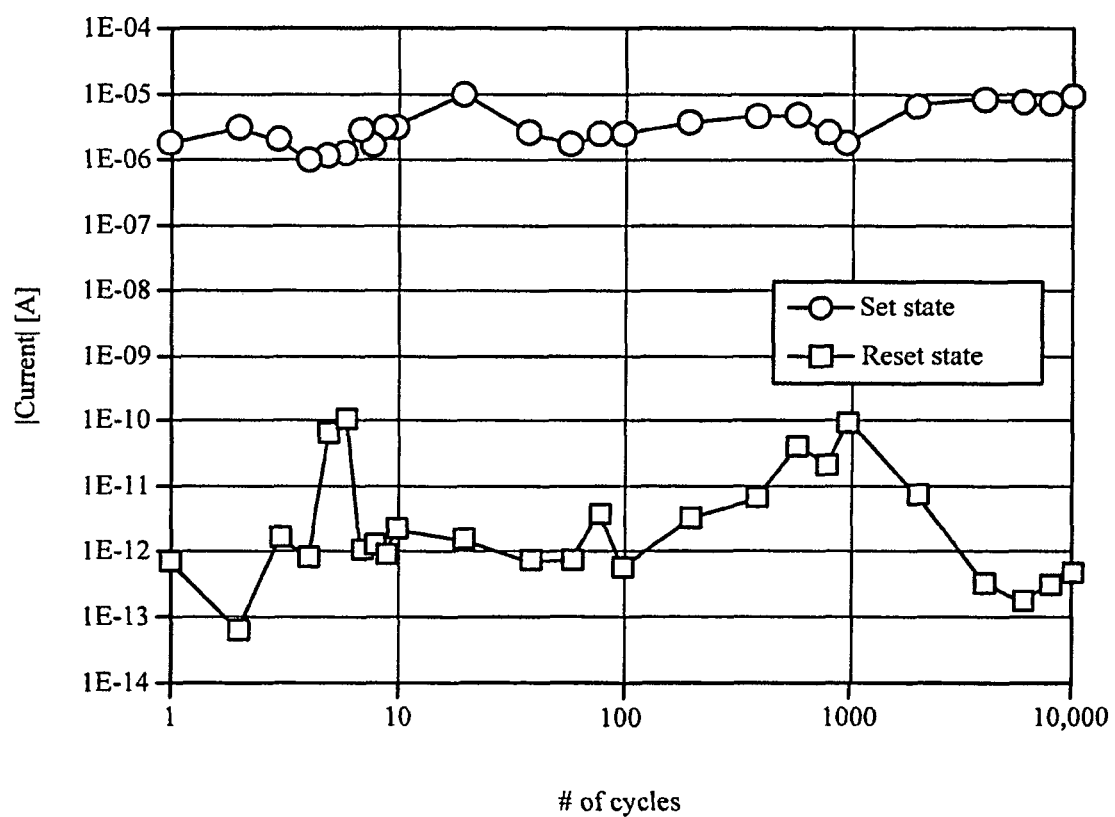
FIG. 19 is a plot showing the measured endurance behavior of a prototype electro-mechanical diode memory cell.

The endurance of an electro-mechanical diode memory cell as described above can be very high. For example, the endurance of the electro-mechanical diode memory cell has been shown to exceed 10⁴ Set/Reset cycles, thereby providing multi-time programmable (MTP) memory cells. FIG. 19 is a plot showing the measured endurance behavior of an exemplary electro-mechanical diode memory cell having a device size of 4×4 μm (Set BL voltage=10V, 100 msec; Reset BL voltage=17V, 200 msec; Read WL voltage=1.2V). Notably, the endurance of the electro-mechanical diode memory cell is limited by the quality of the isolation layer rather than the structural properties of the word line. Specifically, the amount of deflection of the word line at the cross-point is small compared to its length. Therefore, Set/Reset cycles only minimally strain the word line. By using improved isolation layer material (e.g. $Si_3N_4$), the endurance of the electro-mechanical diode memory cell may exceed 10⁹ Set/Reset cycles.

Note that for an electro-mechanical diode memory cell to operate properly, the built-in electrostatic force ($F_{elec}$) in the Set state must be larger than the spring restoring force ($F_{spring}$) in the Set state. The ratio of these forces is described by the following equation:

$$\frac{F_{spring}}{F_{elec}} \propto \left(\frac{t}{l}\right)^3 \cdot \frac{g}{l} \cdot \frac{E}{\varepsilon_{max}}$$

where t is the thickness of the beam, l is the length of the beam, g is the gap thickness, E is the Young's modulus of the beam material and $\varepsilon_{max}$ is the peak electric field strength at the junction between the word line and the bit line in the Set state.

Ideally, this ratio should be maintained (to be less than 1) as the dimensions of the memory cell are scaled down to provide for increased storage density. Therefore, the beam thickness and the gap thickness should be scaled down together with the lateral dimensions of the beam.

Figures 20A, 20B:
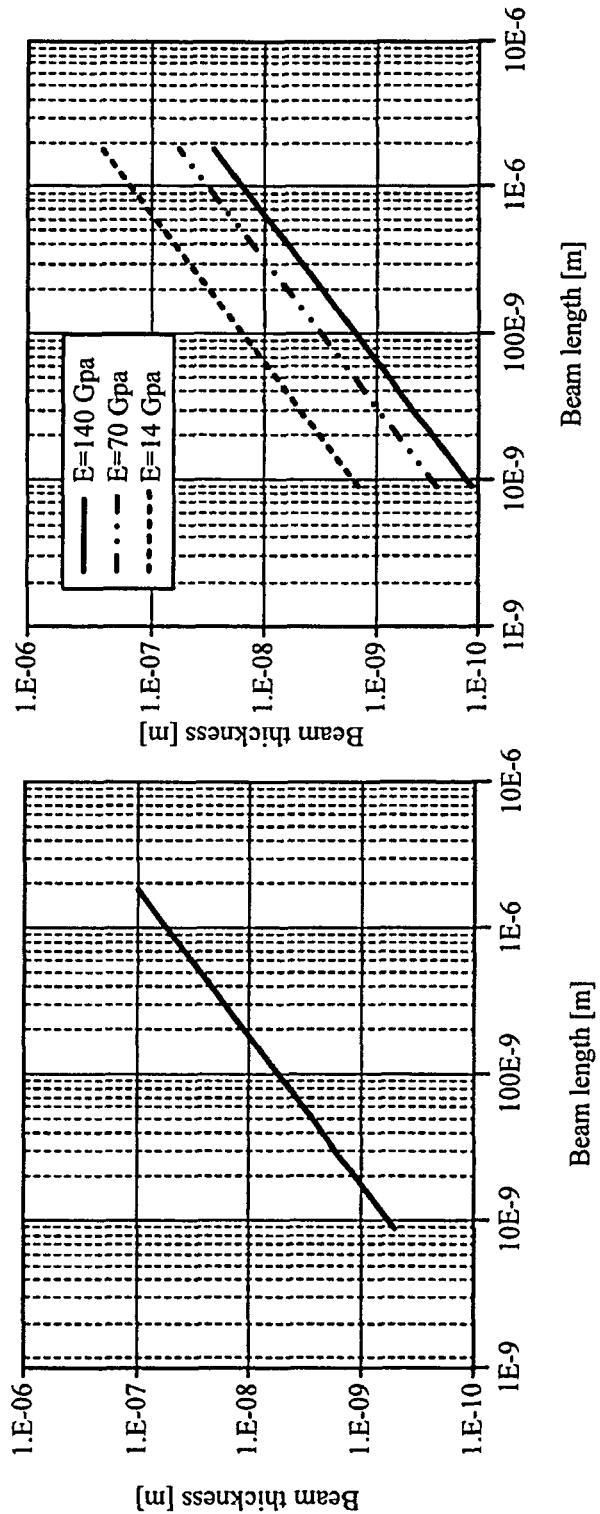
FIGS. 20A and 20B are logarithmic plots showing how the beam length can be reduced with decreasing beam thickness and how the beam thinness can be relaxed by using a material with lower Young's modulus to maintain the same Set/Reset voltage.

FIGS. 20A and 20B show, respectively, how the beam thickness should be reduced (for a fixed gap thickness) with beam length and how the beam thinness requirement can be relaxed by using a beam material with reduced Young's modulus, in an electro-mechanical diode memory cell, to maintain the same force ratio. Because there are practical limits for beam thickness and gap thickness scaling, alternative structural materials with lower Young's modulus can be used to reduce beam stiffness and thereby allow for shorter beam length.

Table III indicates the projected performance characteristics of electro-mechanical diode memory cells. These characteristics were obtained using Finite-Element-Method software for various conductive structural materials with lower Young's modulus, e.g. TiN, TiNi alloy, or carbon nanotube (CNT).

TABLE III

| Technology | 4 μm | 90 nm | 20 nm | 10 nm |
|---|---|---|---|---|
| Cell size | 64 μm² | 0.0324 μm² | 0.002 μm² | 0.0008 μm² |
| F² | 4 F² | 4 F² | 6 F² | 8 F² |
| Structural Material | Poly-SiGe | Al | TiNi | CNT |
| Young's Modulus | 140 GPa | 77 GPa | 14 GPa | 5 GPa |
| Beam Thickness | 100 nm | 5 nm | 4 nm | 3 nm |
| Actual Gap Thickness | 36 nm | 3 nm | 2 nm | 2 nm |
| Set Voltage | 7.0 V | 2.8 V | 2.4 V | 2.1 V |
| Set Time | 21 ns | 0.3 ns | 0.27 ns | 0.12 ns |
| Set Energy | 2.6 × 10⁻¹³ J/bit | 2.6 × 10⁻¹⁶ J/bit | 2.1 × 10⁻¹⁸ J/bit | 5.4 × 10⁻¹⁸ J/bit |

Table IV compares the performance of the above-described electro-mechanical diode memory cell technology to that of current and emerging non-volatile memory technologies. The advantages of the electro-mechanical diode memory cell technology include a wider operation temperature range, lower write energy, and lower cost.

TABLE IV

| Technology | NAND Flash | PCM | Redox RRAM | Electro-mechanical diode |
|---|---|---|---|---|
| Cell Size | 25 F² | 4-6 F² | 5-8 F² | 4-6 F² |
| Mimimum F-Scaling | 16 nm | 5-10 nm | 5-10 nm | 20 nm |
| Storage Mechanism | F-N Tunneling | Phase charge by Joule heating | Ion transport and redox reaction | Mechanical gap closing actuation |
| Write Voltage | 18-20 V | 3 V | <0.5 V | 2.4 V |
| Write Speed | >10 μs | 50-120 μs | <20 ns | 0.27 ns |
| Endurance | 10⁴-10⁵ | 10¹⁵ | 10¹⁶ | >10⁴ |
| Retention | 10 yrs @ 85° C. | 10 yrs @ 85° C. | 10 yrs @ 85° C. | >10 yrs @ 200° C. |
| Ease of Integration | 10 masks | 2-3 masks to BEOL | 2-3 masks to BEOL | 2 masks |
| Write Energy Per Bit | >1 fJ | <2 pJ | 1 fJ | 0.03 fJ |

Figure 21A:
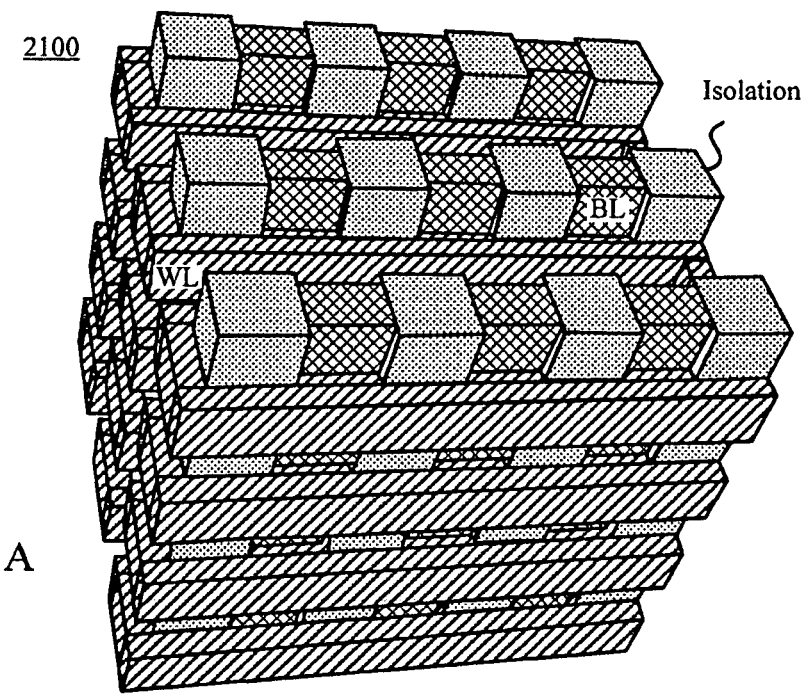
FIG. 21A is an isometric illustration of a three-dimensionally stacked electro-mechanical diode memory array.
Figure 21B:
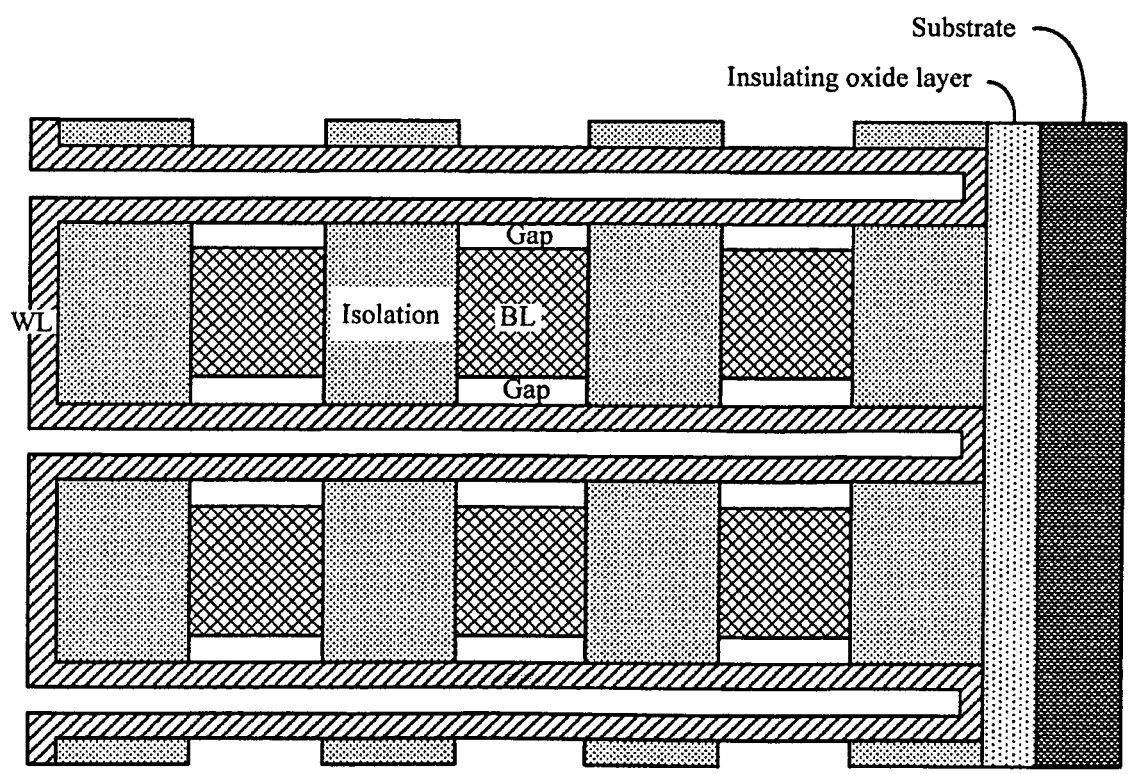
FIG. 21B illustrates the cross-sectional structures of a three-dimensionally stacked electro-mechanical diode memory array.

The structure of the electro-mechanical diode memory cell facilitates its implementation into a three-dimensional (3-D) array 2100, as illustrated in FIG. 21A. For simplicity, the isolation layer and the substrate are not shown in FIG. 21A. In one embodiment, the 3D array 2100 comprises multiple planes formed parallel to each other. Each plane includes the plurality of bit lines and the plurality of word lines formed as described above. FIG. 21B illustrates a cross-sectional view of 3-D array 2100, including the isolation layer and the substrate, based on a cut through one plane of the array. As discussed in reference to FIGS. 3A-3F (above) and FIGS. 22A-22B (below), the bit lines can be formed by patterning one layer or multiple layers. Note that when forming a 3D array, there is no separate etch step to form isolation spacers along the edge of the bits lines. Instead, the isolation spacers are automatically formed when patterning the stack of isolation layer/bit line/isolation layer/bit line etc. into vertical planes by one lithography step and a multi-step RIE. Thus, only two lithography steps (bit lines, word lines) are used to form 3-D array 2100. Note that word line beam actuation occurs in the lateral direction, and that each memory cell has built-in redundancy (two mechanical diodes per memory cell) as shown in FIG. 21B. Also, the bit lines can be relatively thick to maintain adequately low series resistance. The resulting architecture of 3-D array 2100 allows for cost-effective compact implementation for high storage density memory.

Figure 22A:
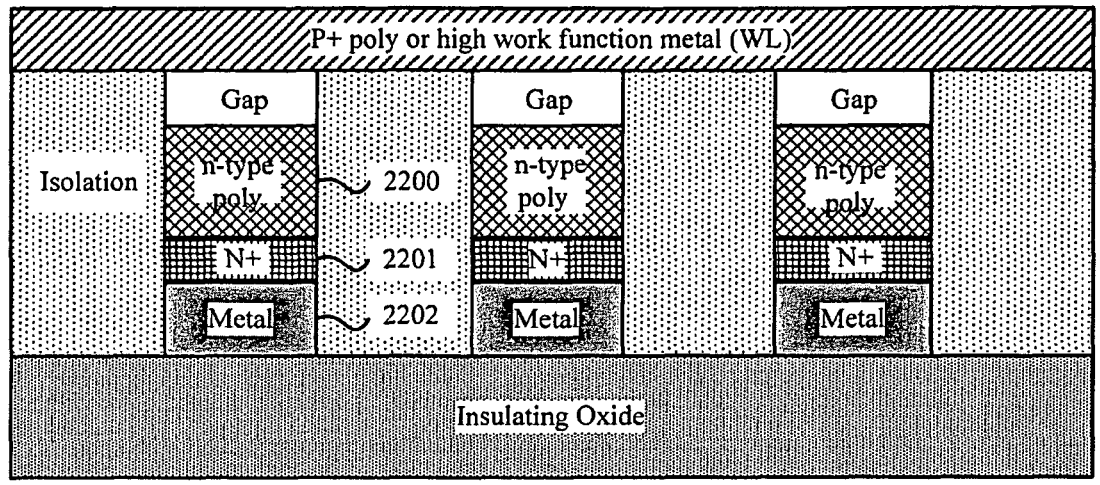
FIGS. 22A and 22B illustrate schematic cross-sections of electro-mechanical diode memory cells in the Reset state using various bit line material stacks.

Note that although specific fabrication embodiments are discussed herein, other materials may be used to implement the electro-mechanical diode memory cells. For example, FIG. 22A illustrates a word line WL including either a heavily doped p-type (P+) semiconductor or a high work function (greater than 4.7 eV) metallic material. A work function is the minimum energy needed to remove an electron from a solid to a point immediately outside the solid surface, wherein the term "immediately" means that the final electron position is far from the surface on the atomic scale, but still close to the solid on the macroscopic scale. If a P+ semiconductor material or a high work function metal is used for word line WL, then the bit line BL can be implemented using a stack including n-type polysilicon 2200, N+ silicon (amorphous or not)

Figure 22B:
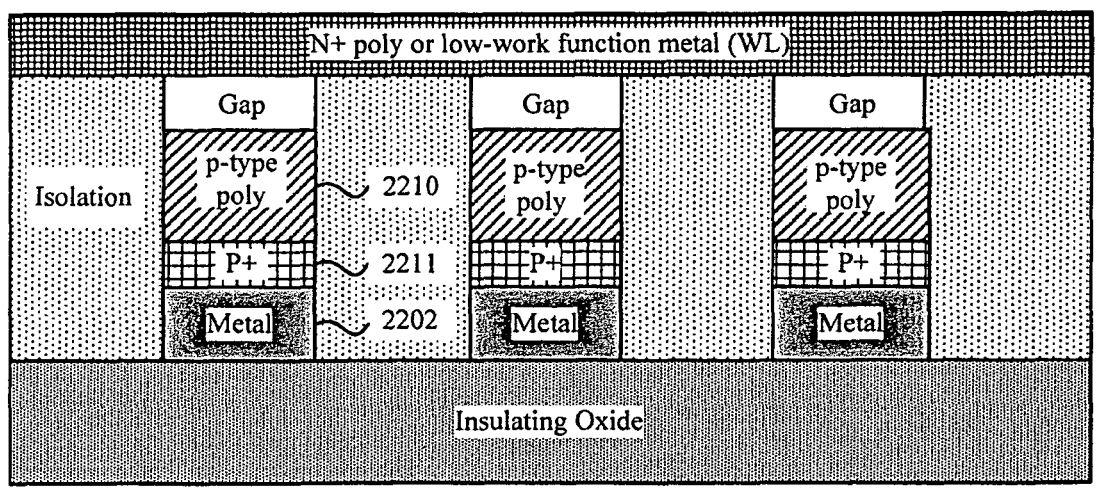

2201, and metal 2202 (e.g. TiN, Al). FIG. 22B illustrates a word line WL including either a heavily doped n-type (N+) semiconductor or a low work function metallic material (less than 4.7 eV). If the N+ semiconductor material or the low work function metallic material is used for word line WL, then the bitline material can include a stack of p-type polysilicon 2210, P+ silicon (amorphous or not) 2211, and metal 2202.

Note that, for a metallic word line material (high or low work function), the electro-mechanical diode memory cell forms a Schottky (metal-semiconductor) diode in the Set state. Good rectifying characteristics have been achieved with Schottky junctions, particularly if the semiconductor is amorphous silicon. For both the p-n junction diode and Schottky diode embodiments, a lightly doped semiconductor material (with dopant concentration less than $1E19/cm^3$) can be used at the junction. A shunting conductive layer or layers can be provided to achieve low bit line resistance. For example, a multi-layered bit-line structure may comprise a lightly doped semiconductor at the surface, a heavily doped semiconductor layer to provide low bit line resistance and good ohmic contact, and a metallic layer to provide low bit line resistance. In one embodiment, a thin oxide layer can be formed on at least one of the bit line and the word line to minimize leakage current, thereby enhancing diode characteristics.

Figure 23A:
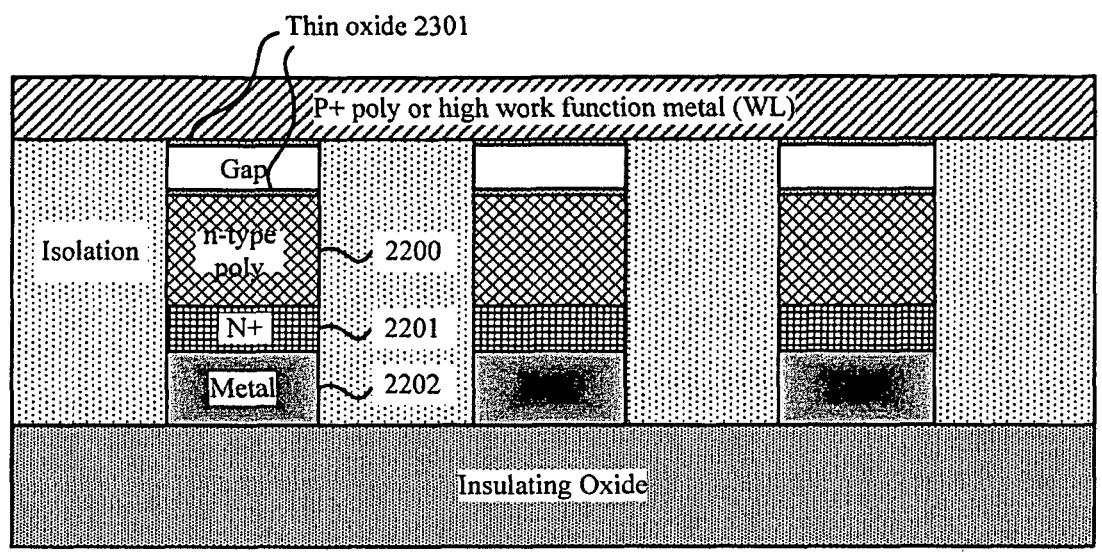
FIGS. 23A, 23B, and 23C illustrate schematic cross-sections of electro-mechanical diode memory cells in the Reset state using various bit line material stacks and oxide coating for the bit lines and word lines.
Figure 23B:
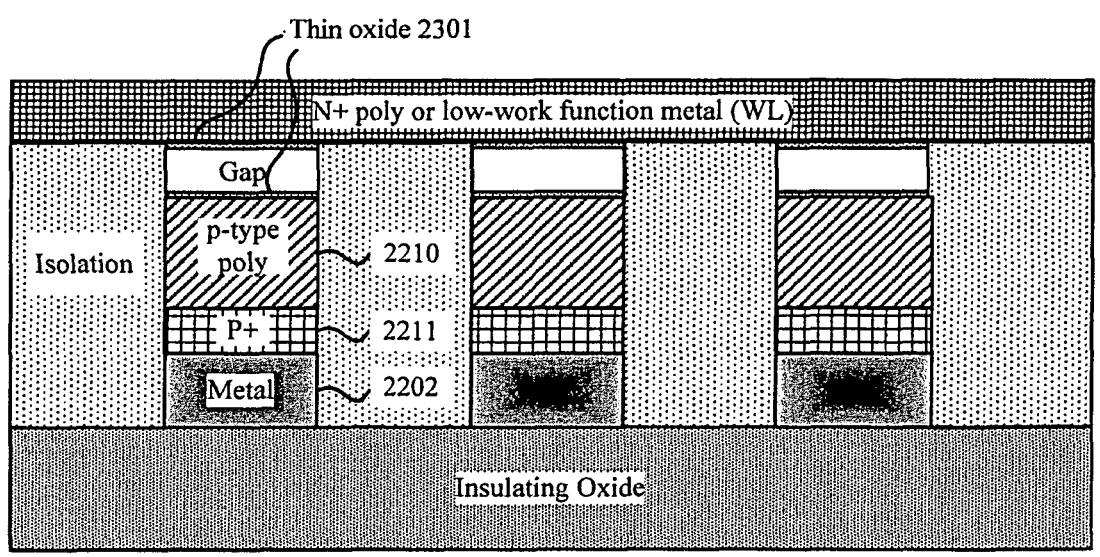
Figure 23C:
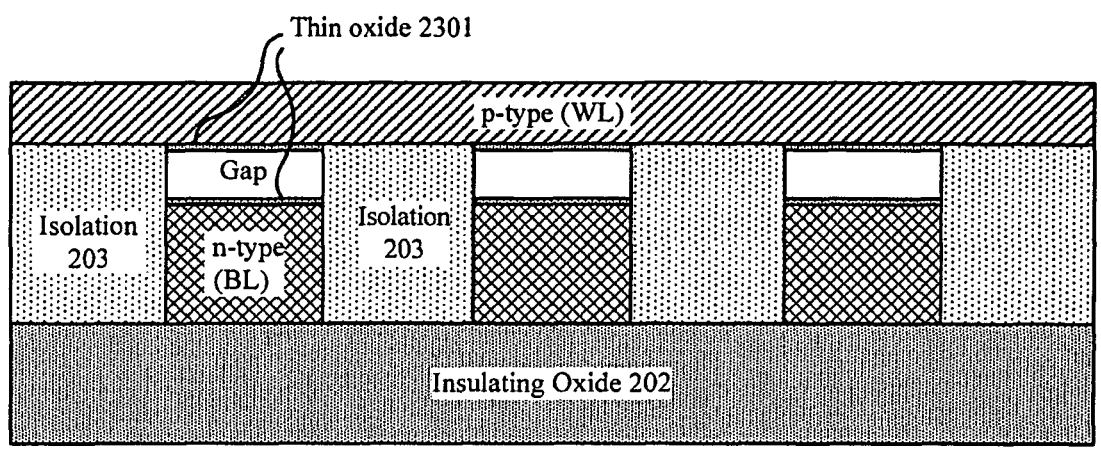

FIGS. 23A and 23B show one implementation in which a thin oxide layer 2301 can be formed within the gap on surfaces of the bit line and/or the word line. Although a bit line formed by stacked materials is shown in FIGS. 23A and 23B, other embodiments may include a bit line formed by a single material. For example, FIG. 23C shows another implementation in which thin oxide layer 2301 can be formed on a bit line BL formed by a single material. In one embodiment, this thin oxide layer can be formed by the natural oxidation of the WL and/or BL surfaces during the course of device fabrication. In another embodiment, this thin oxide layer could be intentionally formed on the WL and BL surfaces, after the selective removal of the sacrificial oxide, by a conformal deposition process, such as atomic layer deposition (ALD).

Although the description above contains many details, these should be construed not as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

The invention claimed is:

1. A non-volatile memory cell array comprising:
a plurality of substantially parallel bit lines; and
a plurality of substantially parallel word lines,
wherein the word lines are oriented substantially orthogonally in relation to the bit lines,
wherein the word lines span the bit lines at a plurality of cross-points,
wherein each cross-point in the plurality of cross-points establishes a memory cell,
wherein each memory cell is configured to transition from an open-circuit state to a diode state in response to a first voltage pulse with a first polarity applied across its corresponding cross-point,
wherein each memory cell is configured to transition from the diode state to the open-circuit state in response to a second voltage pulse with a second polarity opposite to the first polarity applied across its corresponding cross-point,
wherein there is no physical contact between the word line and the bit line at the cross-point defining a memory cell when the memory cell is in the open-circuit state,
wherein there is physical contact between the word line and the bit line at the cross-point defining a memory cell when the memory cell is in the diode state, and
wherein a current rectifying effect is exhibited in the diode state.

2. The non-volatile memory cell array of claim 1, wherein each bit line comprises an n-type semiconductor material, and wherein each word line comprises a p-type semiconductor material.

3. The non-volatile memory array of claim 1, wherein each bit line comprises a stack including an n-type polysilicon, a heavily-doped n-type silicon, and a metal, and wherein each word line comprises a heavily-doped p-type polysilicon.

4. The non-volatile memory cell array of claim 1, wherein each bit line comprises an n-type semiconductor material, and wherein each word line comprises a high work function metallic material.

5. The non-volatile memory array of claim 1, wherein each bit line comprises a stack including an n-type polysilicon, a heavily-doped n-type silicon, and a metal, and wherein each word line comprises a high work function metallic material.

6. The non-volatile memory cell array of claim 1, wherein each bit line comprises a p-type semiconductor material, and wherein each word line comprises an n-type semiconductor material.

7. The non-volatile memory array of claim 1, wherein each bit line comprises a stack including a p-type polysilicon, a heavily-doped p-type silicon, and a metal, and wherein each word line comprises a heavily-doped n-type polysilicon.

8. The non-volatile memory cell array of claim 1, wherein each bit line comprises a p-type semiconductor material, and wherein each word line comprises a low work function metallic material.

9. The non-volatile memory cell array of claim 1, wherein each bit line comprises a stack including a p-type polysilicon, a heavily-doped p-type silicon, and a metal, and wherein each word line comprises a low work function metallic material.

10. The non-volatile memory cell array of claim 1, further comprising multiple planes formed parallel to one another, each plane comprising the plurality of substantially parallel bit lines and the plurality of substantially parallel word lines, wherein the multiple planes form a three-dimensional (3D) memory cell array.

11. A non-volatile memory cell array comprising:
a plurality of substantially parallel bit lines; and
a plurality of substantially parallel word lines,
wherein the word lines are oriented substantially orthogonally in relation to the bit lines,
wherein the word lines span the bit lines at a plurality of cross-points,
wherein each cross-point of the plurality of cross-points establishes a memory cell,
wherein at each cross-point, the bit and word lines have thin oxide coatings forming a coated bit line and a coated word line,
wherein each memory cell is configured to transition from an open-circuit state to a diode state in response to a first voltage pulse with a first polarity applied across its corresponding cross-point,
wherein each memory cell is configured to transition from the diode state to the open-circuit state in response to a second voltage pulse with a second polarity opposite to the first polarity applied across its corresponding cross-point,
wherein there is no physical contact between the coated word line and the coated bit line at the cross-point defining a memory cell when the memory cell is in the open-circuit state,
wherein there is physical contact between the coated word line and the coated bit line at the cross-point defining the memory cell when the memory cell is in the diode state, and
wherein a current rectifying effect is exhibited in the diode state.

12. The non-volatile memory cell array of claim 11, wherein each bit line comprises an n-type semiconductor material, and wherein each word line comprises a p-type semiconductor material.

13. The non-volatile memory array of claim 11, wherein each bit line comprises a stack including an n-type polysilicon, a heavily-doped n-type silicon, and a metal, and wherein each word line comprises a heavily-doped p-type polysilicon.

14. The non-volatile memory cell array of claim 11, wherein each bit line comprises an n-type semiconductor material, and wherein each word line comprises a high work function metallic material.

15. The non-volatile memory array of claim 11, wherein each bit line comprises a stack including an n-type polysilicon, a heavily-doped n-type silicon, and a metal, and wherein each word line comprises a high work function metallic material.

16. The non-volatile memory cell array of claim 11, wherein each bit line comprises a p-type semiconductor material, and wherein each word line comprises an n-type semiconductor material.

17. The non-volatile memory array of claim 11, wherein each bit line comprises a stack including a p-type polysilicon, a heavily-doped p-type silicon, and a metal, and wherein each word line comprises a heavily-doped n-type polysilicon.

18. The non-volatile memory cell array of claim 11, wherein each bit line comprises a p-type semiconductor material, and wherein each word line comprises a low work function metallic material.

19. The non-volatile memory array of claim 11, wherein each bit line comprises a stack including a p-type polysilicon, a heavily-doped p-type silicon, and a metal, and wherein each word line comprises a low work function metallic material.

20. The non-volatile memory cell array of claim 11, further comprising multiple planes formed parallel to one another, each plane comprising the plurality of substantially parallel bit lines and the plurality of substantially parallel word lines, wherein the multiple planes form a three-dimensional (3D) memory cell array.

21. A memory cell comprising:
a bit line; and
a word line oriented substantially orthogonally in relation to the bit line, the word line crossing the bit line at a cross-point, the cross-point establishing the memory cell,
wherein the memory cell is configured to transition from an open-circuit state to a diode state in response to a first voltage pulse with a first polarity applied across the cross-point,
wherein the memory cell is configured to transition from the diode state to the open-circuit state in response to a second voltage pulse with a second polarity opposite to the first polarity applied across the cross-point,
wherein there is no physical contact between the word line and the bit line at the cross-point when the memory cell is in the open-circuit state,
wherein there is physical contact between the word line and the bit line at the cross-point when the memory cell is in the diode state, and
wherein a current rectifying effect is exhibited in the diode state.

22. A memory cell comprising:
a bit line; and
a word line oriented substantially orthogonally in relation to the bit line, the word line crossing the bit line at a cross-point, the cross-point establishing the memory cell, wherein at the cross-point, the bit and word lines have thin oxide coatings forming a coated bit line and a coated word line,
wherein the memory cell is configured to transition from an open-circuit state to a diode state in response to a first voltage pulse with a first polarity applied across the cross-point,
wherein the memory cell is configured to transition from the diode state to the open-circuit state in response to a second voltage pulse with a second polarity opposite to the first polarity applied across the cross-point,
wherein there is no physical contact between the coated word line and the coated bit line at the cross-point defining a memory cell when the memory cell is in the open-circuit state,
wherein there is physical contact between the coated word line and the coated bit line at the cross-point defining the memory cell when the memory cell is in the diode state, and
wherein a current rectifying effect is exhibited in the diode state.

* * * * *